(12) United States Patent
Hilliard

(10) Patent No.: US 7,931,787 A0
(45) Date of Patent: Apr. 26, 2011

(54) ELECTRON-ASSISTED DEPOSITION PROCESS AND APPARATUS

(76) Inventor: Donald Bennett Hilliard, Tucson, AZ (US)

( * ) Notice: Subject to any disclaimer, the term of this patent is extended or adjusted under 35 U.S.C. 154(b) by 182 days.

(21) Appl. No.: 10/375,938

(22) Filed: Feb. 26, 2003

(65) Prior Publication Data

US 2003/0161969 A1 Aug. 28, 2003

Related U.S. Application Data

(60) Provisional application No. 60/359,965, filed on Feb. 26, 2002.

(51) Int. Cl.
*C23C 14/35* (2006.01)
*C23C 16/00* (2006.01)

(52) U.S. Cl. ......... 204/298.06; 204/298.16; 204/298.19; 118/723 R; 118/723 VE; 118/723 EB; 118/723 FE; 118/723 HG; 118/723 E

(58) Field of Classification Search ............. 204/192.12, 204/298.06, 298.15, 298.16, 298.17, 298.18, 204/298.19; 118/723 R, 723 VE, 723 HC, 118/723 DC, 723 E, 723 EB, 723 FE; 427/569, 427/570, 571, 595, 596, 248.1
See application file for complete search history.

(56) References Cited

U.S. PATENT DOCUMENTS

| | | | |
|---|---|---|---|
| 3,144,552 A | 8/1964 | Schonberg | |
| 3,544,445 A * | 12/1970 | Moseson et al. | 204/298.06 |
| 3,702,412 A | 11/1972 | Quintal | |
| 4,111,783 A | 9/1978 | Bindell | |
| 4,155,825 A | 5/1979 | Fournier | |
| 4,499,520 A | 2/1985 | Cichanowski | |
| 4,588,490 A | 5/1986 | Cuomo | |
| 4,647,818 A | 3/1987 | Ham | |
| 4,664,769 A | 5/1987 | Cuomo | |
| 4,885,070 A | 12/1989 | Campbell | |
| 4,954,371 A | 9/1990 | Yializis | |
| 5,234,560 A * | 8/1993 | Kadlec et al. | 204/192.12 |
| 5,440,446 A | 8/1995 | Shaw | |
| 5,670,415 A | 9/1997 | Rust | |
| 5,702,573 A | 12/1997 | Biberger | |
| 6,035,805 A | 3/2000 | Rust | |
| 6,153,061 A | 11/2000 | Tzeng | |
| 6,203,898 B1 | 3/2001 | Kohler | |
| 6,224,725 B1 | 5/2001 | Glocker | |
| 6,787,010 B2 * | 9/2004 | Cuomo et al. | 204/298.07 |

OTHER PUBLICATIONS

Window, B. (1996). "Issues in magnetron sputtering of hard coatings." Surface and Coatings Technology 81: 92-98.
Savvides, N. and B. Window (1986). "Unbalanced magnetron ion-assisted deposition and property modification of thin films." J. Vac. Sci. Technol. A 4(3): 504-508.

(Continued)

*Primary Examiner* — Rodney G. McDonald

(57) ABSTRACT

Previous limitations in utilizing energetic vapor deposition means are addressed through the introduction of a novel means of vapor deposition, namely, an Electron-Assisted Deposition (EAD) process and apparatus. The EAD mode of film growth disclosed herein is generally achieved by, first, forming a magnetic field that possesses field lines that intersect electrically non-grounded first and second surfaces, wherein at least one surface is a workpiece, thereby forming a magnetic trap between first and second surfaces; second, introducing a high flux of electrons axially into the magnetic field existing between the first and second surfaces, so that the electrons form an electron-saturated space-charge in the space adjacent to the substrate, wherein plasma interactions with the substrate are substantially avoided, and modification of film growth processes is provided predominantly by electron—rather than plasma—bombardment.

1 Claim, 14 Drawing Sheets

OTHER PUBLICATIONS

Window, B. and N. Savvides (1986). "Charged particle fluxes from planar magnetron sputtering sources." J. Vac. Sci. Technol. A 4(2): 196-202.

Window, B. and N. Savvides (1986). "Unbalanced dc magnetrons as sources of high ion fluxes." J. Vac. Sci. Technol. A 4(3): 453-456.

Window, B., F. Sharples, et al. (1985). "Magnetically confined sputter source with high ion flux." J. Vac. Sci. Technol. A 3(6): 2368-2372.

Inoue, T. and e. al (2001). "Electron-beam-assisted evaporation of epitaxial CeO2 thin films on Si substrates." J. Vac. Sci. Technol. A 19(1): 275-279.

Inoue, T. and et al. (1999). "Low temperature epitaxial growth of CeO2 (110) layers on Si (100) using electron beam assisted evaporation." Thin Solid Films 343-344: 594.

Inoue, T. and e. al (2000). "Surface morphology analysis in correlation with crystallinity of CeO2(110) layers on Si(100) substrates." J. Vac. Sci. Technol. 18(4): 1613-1618.

Stoffels, E. and W. Stoffels (2001). "Near-surface generation of negative ions in low-pressure discharges." J. Vac. Sci. Tech. A 15(5): 2109.

Yumoto, H. and e. al (2002). "Corrosion and stability of cementine films prepared by electron shower." Vacuum 65: 527-531.

Li, S. J. and e. al (1998). "Characterization of cementite films prepared by electron-shower-assisted PVD method." Thin Solid Films 316: 100-104.

Li, S. J. (1999). "Effects of the power of electron shower and substrate bias on the synthesis of cementite films." Thin Solid Films 345: 23-28.

Kelly, P. J. and R. D. Arnell (1998). "The influence of magnetron configuration on ion current density and deposition rate in a dual unbalanced magnetron sputtering system." Surface and Coatings Technology(108-109): 317-322.

Park, C.-H. and e. al (2000). "Surface-discharge characteristics of Mg-O-thin films prepared by reactive RF unbalanced magnetron sputtering." Thin Solid Films 00: 1-7.

Sawabe, A. and T. Inuzuka (1986). "Growth of diamond thin films by electron-assisted chemical vapor deposition and their characterization," Thin Solid Films 137: 89-99.

Pribil, G. and e. al (2001). "Deposition of electronic quality amorphous silicon, a-Si:H, thin films by hollow cathode plasma-jet reactive sputtering system." J. Vac. Sci. Technol. A 19(4): 1571-1576.

Park, C.-H. and e. al (1998). "TiN hard coating prepared by sputter ion plating system with facing target sputtering source and RF discharge." Thin Solid Films 312: 182-189.

\* cited by examiner

ELECTRON-ASSISTED DEPOSITION PROCESS AND APPARATUS

This application claims the benefit of provisional application No. 60/359,965 filed Feb. 26, 2002.

FIELD OF THE INVENTION

The present invention relates generally to processes and equipment utilized in the vapor deposition of thin films, and, in particular, a vapor deposition apparatus that provides modification of the film growth process through bombardment of the depositing film with a heavy electron flux. In its first preferred embodiment, the disclosed invention comprises a sputtering apparatus that provides an effective electron trap for implementing what may be termed as electron-assisted deposition (EAD). Potential applications exist in the fabrication of integrated circuits, optical elements, optoelectronic devices, and other thin or thick film structures in which thin film growth can benefit from non-equilibrium or activating growth conditions, but for which heavy ion bombardment is undesirable.

DESCRIPTION OF THE RELATED ART

Deposition methods utilizing energetic means that deliver energetic particles to the growth front of a depositing film have been favored in thin film deposition, since such energetic means are capable of achieving well-adhering, stoichiometric, and dense layers of compound materials. Such energetic means will typically be in the form of either an ion-assisted deposition (IAD) process, or one of various deposition processes wherein energetic interactions with a depositing film are essentially that of a weak plasma. However, use of such energetic means incur additional challenges.

Delineating the effects of plasma-generated species in the growth of a non-metallic thin film continues to be difficult, since there are only indirect and unreliable means available to ascertain the behavior of charge and energetic species at the growth interface of an electrically floating surface. This difficulty is also due, in part, to the fact that such electronegative species as oxygen are quite prone to becoming negatively ionized.

A question that has not been sufficiently addressed in the vapor deposition art is whether or not it is possible to produce a practical deposition environment in which an electron gas is made to impinge on the electrically floating surface of a growing film for modification of growth behavior; this, without simultaneously producing positive ion bombardment to equilibrate the arrival rate of positive and negative charge. If such a scenario were realized, it would then form a basis for an electron-assisted deposition (EAD) process.

To distinguish an EAD process from a plasma-assisted, or ion-assisted deposition process, we must be able to clearly demonstrate electron-dominated bombardment of the growing film. Also, if EAD is to be a meaningful term, we must be able to clearly differentiate the results of the EAD process from that of either plasma-assisted growth or an ion-assisted deposition (IAD) process. There is not found, in the vapor deposition literature, any account of another research group reporting what one may claim as a definitive EAD process. Potential reports of an EAD process do not satisfy the above conditions, in that they fail to demonstrate a verifiable method for eliminating the ion contribution, nor do they demonstrate a resulting growth process that may be distinguished from that of low energy plasma bombardment.

The term "electron-assisted deposition" has been used frequently in the past to describe film growth wherein a hot filament, or other electron source, is used in conjunction with chemical vapor deposition (CVD) of a material, typically diamond. This usage was introduced by Sawabe and Inuzuka (Thin Solid Films, vol. 137, pp. 89–99, 1986) for referring to such a CVD process, and has become commonplace. However, while the usage of such terms as "electron-assisted chemical vapor deposition" does recognize functionality of electrons in electron-activated film growth processes, such processes are performed at much higher gas pressures than those allowed to attain the environment of an electron gas—rather than a weak plasma—found in the present invention. Such unconfined, higher pressure, electron emission will only cause an electrically floating surface to become negatively charged until positive and negative charge arrival are equilibrated, in accordance with the congruence principle, which is a standard plasma interaction. That the electron component of the weak plasma formed in these CVD processes is recognized as essential does not provide a physical basis for eliminating the positive ion bombardment—or its effect—that is also a required component of such processes, nor has there been offered any suggestion of how such positive ion bombardment might be eliminated.

Some recent reports by Inoue et al are based upon experimental efforts in "electron-beam assisted deposition" of $CeO_2$ on silicon, by way of installing a secondary thermionic filament near the substrate, in an existing e-beam evaporation system. These prior accounts of electron-beam assisted deposition resulted in the observation of a lowered epitaxial temperature for the growing oxide film [Inoue, 1997 #132; Inoue, 1999 #133; Inoue, 2000 #129]. However, such effects as a lowering of the required epitaxial growth temperature are not distinguishable from the effects readily obtained with low-energy ion bombardment, nor is there cited a mechanism by which the bombardment of the insulating film would not result in the equilibration of positive ion and negative charge arrival at the insulated portions (corresponding to the desired insulating film) of the substrate.

The electron bombardment of any electrically floating surface in a deposition process will tend to develop weak plasma-like interactions, at least in so far as the floating surface will electrically self-bias until the arrival rate of positive ions and negative charge at the floating surface equilibrates, in accordance with the "congruence assumption" used in plasma analysis. As such, even relatively sparse creation of bombarding gas/vapor ions will result in equilibration of positive and negative charge flux to an electrically floating substrate surface, wherein ion bombardment will easily dominate growth behavior of a depositing film, since the typical gas/vapor atoms in any deposition process will be 1,800 to 100,000 times the mass of the electrons. Thus, while many deposition methods are known to bombard the substrate surface with electrons, energetic gas-phase interactions with a depositing non-metallic film will normally be in the form of such plasma bombardment.

It therefore remains problematic to positively identify an electron-assisted, as opposed to a plasma-assisted, process. Positive identification would require observation of growth behavior that is not also characteristic of an ion-assisted or plasma-assisted process. Clearly, verifying a substantial bombarding electron current by grounding it through the growing film is of little practical use for nonmetallic films, nor would it isolate the effects of bombardment from the (normally unwanted) effects of electron conduction through the growing film. In addition, it should be understood that providing a grounded substrate does not entail that the surface of an insulating film, deposited on the substrate, is grounded.

Alternatively, the bombardment of many floating dielectric surfaces with high energy electrons, typically in the KeV range, can obviate the need of charge compensation at the surface, due to the secondary electron coefficient of many dielectric materials rising above unity at high primary electron energies. However, such high electron energies would normally be impractical to implement over large substrates, or in a practical deposition environment. Such high electrical fields—in the many kVolt range—are used in vacuum web processes for the curing of organic films, wherein the dielectric film is supported by a grounded substrate for achieving the required field; however, this is a post-deposition process, as opposed to the assisted film growth processes that are addressed in the present invention.

In the sputtering art, injection of electrons into the volume between the cathode and substrate has commonly been performed in sputtering configurations referred to generally as "triode" and "tetrode" sputtering. These latter sputtering methods utilize an electron source—usually a thermionic filament—for injecting electrons into the deposition space of, basically, a diode sputtering arrangement, wherein the sputtering plasma is not magnetically confined. The injection of electrons in these devices allows for the establishment of higher ionization rates, higher plasma densities, and lower operating pressures.

In the magnetron sputtering art, the introduction of additional electrons into the deposition space was performed in U.S. Pat. No. 4,588,490, by Cuomo et al, wherein it is noted that an auxiliary electron source may be effectively utilized to increase the plasma density in a magnetron sputtering process. The emission from a hollow cathode is found effective for increasing ionization of the gas when the hollow cathode emits electrons within the magnetic trap of the magnetron sputter source. These findings have been similarly realized in subsequent magnetron sources.

In more recent years, there have been reports of injecting electrons into the field of an unbalanced magnetron (UBM), as introduced by Savvides and Window. However, these previous reports were again based on attempts to increase ionization and enhance plasma bombardment of coatings, such as nitride tool coatings, that benefit from the ion-bombardment of on-axis "Type II" UBM's. As is consistent with the prior art, the term "Type II" UBM will herein refer to magnetron sputter sources that possess an outer magnet assembly that produces an excess of magnetic field lines, relative to that of an inner magnet assembly. These excess field lines will terminate at chamber surfaces other than those of the cathode, wherein some field lines may terminate at a substrate placed opposite the cathode, so that a magnetic "trap" will channel plasma toward the substrate. The resulting magnetic trap is known to create plasma interactions with the substrate, so that substantial ion bombardment of the substrate is achieved.

Penfold has found that such a magnetic trap may also be realized with inner and outer magnetic assemblies possessing matched (i.e., "balanced") field strengths, and that as long as the placement of grounding surfaces dictates termination of the magnetron's magnetic field lines at the substrate, such plasma bombardment may be achieved. In any case, the term, "UBM", will herein refer to magnetron sputtering apparatuses that provide magnetic field lines that intersect the substrate, so that ion bombardment of the substrate is realized. Such a UBM apparatus may comprise a single magnetron source, or, as discussed in the prior art, a combination of sources that provides a contiguous magnetic trap. A more complete description of the UBM operational characteristics and design may be found in Penfold's exposition in *The Handbook of Thin Film Process Technology* (Glocker, ed.).

In prior art accounts of electron injection into a UBM, high-temperature, polycrystalline (including textured polycrystalline) coatings, such as diamond-like carbon (DLC), chromium nitride, hafnium nitride, and other such tribological coatings benefit from "low energy" ion bombardment of tens to hundreds of eV. However, such ion energies, as described in these prior accounts, are incompatible with the requirements of many damage-sensitive thin film applications, wherein ion bombardment energy in excess of interatomic bond strengths—one to several eV—can cause such undesirable effects as crystalline defects, mechanical stress, or resputtering of a volatile film constituent. Damage-sensitive thin film applications, including those of epitaxial thin film growth, or those of various multi-component compounds that possess an easily re-sputtered or volatilized component, are therefore not compatible with such processes that provide energetic ion bombardment. Hence, one will not find, in the prior art, on-axis "Type II" UBM sputter deposition being successfully used for such applications.

Further elaboration of UBM design has resulted in the convention of referring to the magnetic fields of such devices as either "open" or "closed". Generally, magnetic fields in which the field lines do not terminate at a pole piece are referred to as open fields, in that charged particles may be easily lost at whichever surface the open field lines terminate.

The term "magnetic assembly" will be used herein to refer to any structure disposed to provide a magnetic pole (north or south) for magnetic field lines that traverse open space. As such, a magnetic assembly may comprise a permanent magnet, an electromagnet, or any combination of the same. The terms, "substrate", and "workpiece", will herein refer to the article on which material is being deposited.

Consistent with the terminology of the prior art, the term "on-axis" deposition will herein refer to deposition configurations wherein at least a portion of the substrate or fixture can be, at some point during deposition, intersected by a depositing vapor flux that is substantially parallel to the deposition axis. In sputtering, on-axis sputtering may be easily distinguished from 90-degree off-axis sputtering, wherein the substrate is placed completely outside of the path of such on-axis vapor flux.

SUMMARY OF THE INVENTION

The previously cited limitations in utilizing energetic vapor deposition means, as recognized in the present invention, are addressed through the introduction of a novel means of vapor deposition, namely, an Electron-Assisted Deposition (EAD) process and apparatus. The EAD mode of film growth disclosed herein is generally achieved by, first, forming a magnetic field that possesses field lines that intersect electrically non-grounded first and second surfaces, wherein at least one surface is a workpiece, thereby forming a magnetic trap between first and second surfaces; second, introducing a high flux of electrons into the magnetic field existing between the first and second surfaces, so that the electrons form an electron-saturated space charge, wherein formation of an ion sheath with damaging ion bombardment at the substrate is substantially avoided.

It is found in the present invention that, by floating the substrate surface electrically, and introducing a sufficient electron flux into the center region of the magnetic field, the magnetic field lines that intersect the substrate will be effectively "closed" at the substrate, even though the magnetic trap might be considered "open" by previous conventions. Electron space-charge within the magnetic field can then be rendered sufficiently dominant to preclude the formation of a plasma sheath at the substrate, so that damaging plasma-type bombardment—namely by ions—of the growing film is substantially avoided.

In the present invention, damaging ion bombardment of the growing film is found absent even under the highly negative substrate self-bias potentials, greater than −200 VDC, imposed by the bombarding electrons of the invention. The requirements of the "congruence assumption" are obviated by allowing charge compensation at the electrically floating substrate to occur, not through the equal arrival rate of positive ions and negative charge, but through allowing the substrate to bias negatively, and to stabilize at a point where electron departure from the substrate becomes equal to the electron arrival rate. This establishment of electron flux from the substrate is thought to occur primarily through primary/secondary electron exchange, wherein the magnetic trap effectively enforces a state of unity in the secondary electron coefficient of the depositing film. Alternatively, the point of stabilization of electron flux to and from the substrate surface may also occur, or be modified, through field emission, photoemission, or simply by conducting a relatively small current of electrons from the substrate fixture.

In the preferred embodiment, the effective closure of the magnetic trap coincides with a relatively high (typically greater than −100 VDC) self-bias potential at the floating substrate, which thereby provides an electrostatic mirror at what would normally be the open end of the magnetic field. Contrary to previous reports of magnetically aided deposition processes, the magnetically trapped electrons in the present invention do not produce a plasma sheath at the substrate, nor may the primary role of the electrons in film modification be characterized by the ionization of gas atoms for subsequent ion bombardment of the film/substrate. Also, in the present invention, a much more negative substrate potential does not produce an increased bombardment effect by positive ions, as previously reported. Rather, a significant increase in negative potential of the substrate, in the present invention, marks a transition to an electron-dominated space-charge in the magnetic trap, such that electron—not ion—bombardment is the dominant mechanism modifying film growth.

As a result of this FAD operational mode, increasing the negative self-bias of the substrate surface does not result in an increased ion bombardment effect in the present invention, because the bias of the substrate is not an applied acceleration potential, but rather, a reflection of the local electron-saturated field within the magnetic trap. By the formation of an efficient electron trap, and subsequently saturating the trap with electronic charge, a damaging plasma sheath is unable to form at the growing film. Thus, the disclosed mode of operation is described herein as a "saturation" of the magnetic field with electrons. The term "saturation" may be defined variously in this context, but will be defined here as a condition producing a sufficient effect to obviate the formation of plasma sheaths that produce damaging ion energies.

The practical effects of this EAD process may be contrasted with previous ion-assisted, or plasma-assisted, thin film deposition processes in that the damaging effects of ion bombardment are eliminated. Another practical result of the EAD deposition process is that it allows, for the first time, metallic-mode reactive sputtering of such complex compositions as the multicomponent ferroelectics and High-$T_c$ materials. The metallic-mode reactive sputter deposition of such complex materials is enabled by the activation-limited nature of film growth in the EAD mode, wherein the dominating mechanism of electron bombardment activates surface reactions and substantially increases effective sticking coefficients of the more volatile vapor constituents, thereby obtaining the desired material at the substrate. In this way, required oxygen—or other reactive gas—pressures are much lower, so that poisoning of a metal sputtering target in the process can be substantially avoided, and the sputtering target can be operated well into the metallic-mode region of the target hysteresis curve. At the same time, re-sputtering of the growing film, due to the formation of negative ions of the reactive gas at the target surface, is also substantially eliminated.

As will be further supported, the environment of the depositing film demonstrates the earlier suggested criteria for establishing an EAD process: first, there is verifiable energetic bombardment of the growing film that is clearly dominated by electron, rather than ion, current; and, second, the effects of the energetic bombardment are clearly differentiated from the effects of ion, or plasma, bombardment.

Some of the damage-sensitive films that could benefit from various embodiments of the disclosed deposition process and apparatus, in general, include those deposited epitaxially on a single crystal substrate, or those multicomponent films containing easily re-sputtered elements. The term "epitaxy" will refer herein, as elsewhere, to the growth of a crystalline material on a single-crystalline substrate, wherein the grown material is uniformly aligned to the substrate's crystal lattice in its three axes.

In accordance with the first preferred embodiments, the present invention is initially disclosed as a modification of previous "Type II" unbalanced magnetron apparatuses and processes. The EAD process is accomplished in this first embodiment by reversing the operational characteristics that have, up to the present invention, been attributed to an unbalanced "Type II" magnetron, as previously discussed. In contrast to prior art UBM processes, an objective of the present invention is not to maximize ionization of the working gas near the substrate, neither is it to form plasma-like characteristics at the substrate. In fact, these prior art objectives are contrary to the operation of the present invention.

In direct contrast to the established behavior of "Type II" magnetrons in on-axis deposition, wherein the substrate is heavily bombarded with energetic ions, thin film growth in the present invention is characterized instead by heavy electron bombardment. The electron bombardment of the disclosed invention does not cause the substrate damage that is associated with the former ion bombardment, and accordingly allows on-axis deposition of damage sensitive films. In particular, the present invention also comprises the introduction of a on-axis "Type II" UBM process and apparatus for depositing such damage sensitive materials as the lead and bismuth containing perovskite oxides; e.g., the lead zirconate titanate (PZT) family, or layered perovskites such as strontium bismuth tantalate (SBT).

While the EAD operational mode is disclosed, in its first preferred embodiment, as a sputtering process, the novel aspects of the invention can be applied to a variety of so-called "physical vapor deposition" techniques. In fact, the use of an electron-saturated magnetic trap, which terminates at the workpiece, may be utilized to similar advantages in conjunction with almost any low-pressure (typically, the lower transition-flow pressure region) vapor deposition technique. The disclosed invention is seen to be particularly useful in the reactive deposition of compound materials. Furthermore, the disclosed source, in one embodiment, may be utilized within a cluster of such sources, so that problems normally associated with processing large substrates may be overcome, since a plurality of both electron sources and reactive gas injection sources may then be interspersed between the sources for homogenous treatment of the substrate.

Because a substantial flux of electrons must be introduced into the magnetic field to achieve the disclosed EAD mode, the point of introduction is significant, as electrons introduced in less favorable locations will result in a significant fraction grounding on various chamber elements, rather than interacting with the substrate. As such, the electrons are preferably introduced at a location in the magnetic trap that requires the maximum number of magnetic field lines, or magnetic field surfaces, to be traversed before the electrons are allowed to escape the trap.

Because the diffusion of electrons across magnetic field lines is determined primarily by electron space-charge/field interactions, rather than by ambipolar plasma interactions, homogeneous electron bombardment does not require that the electrons be equally delivered to all magnetic field lines. As opposed to plasma-type interactions wherein the space charge is much closer to neutral, the negative and mutually repulsive interactions of the electron-dominated space charge will result in the electrons diffusing across magnetic field lines to the outer perimeter of the magnetic trap, therein finding a path to ground. A practical advantageous result is much more uniform bombardment of the substrate with electrons, relative to the non-uniformity of plasma bombardment in prior UBM sources. Another practical and advantageous result is that the disclosed invention provides for a spatially homogenous deposition, which is in contrast to the inhomogeneous distribution characteristic of previous, especially reactive, "Type II" UBM processes.

Another advantage of the disclosed EAD process is that the substrate temperature required for the growth of the desired material phase can be significantly lower than that required in other deposition processes. This is due to the highly non-equilibrium nature of the EAD process, where electron bombardment of the surface may create material phases characteristic of much higher temperatures than that of the bulk substrate. For instance, desired phases of Group IV B metal oxides, such as $ZrO_2$, may be formed on silicon at bulk substrate temperatures below 600C., thereby avoiding formation of an interfacial amorphous layer at the oxide/silicon interface. The highly activating, non-equilibrium character of the disclosed invention also makes it particularly suitable for material processes, such as GaN or diamond deposition, that benefit from such high activation.

Other objects, advantages and novel features of the invention will become apparent from the following description thereof.

BRIEF DESCRIPTION OF DRAWINGS

FIG. 9 also serves to illustrate the use of an ultraviolet source for photoemission of electrons.

DESCRIPTION OF THE PREFERRED EMBODIMENTS

The following description and FIGS. 1–14 of the drawings depict various embodiments of the present invention. The embodiments set forth herein are provided to convey the scope of the invention to those skilled in the art. While the invention will be described in conjunction with the preferred embodiments, various alternative embodiments to the structures and processes illustrated herein may be employed without departing from the principles of the invention described herein.

Figure 1:
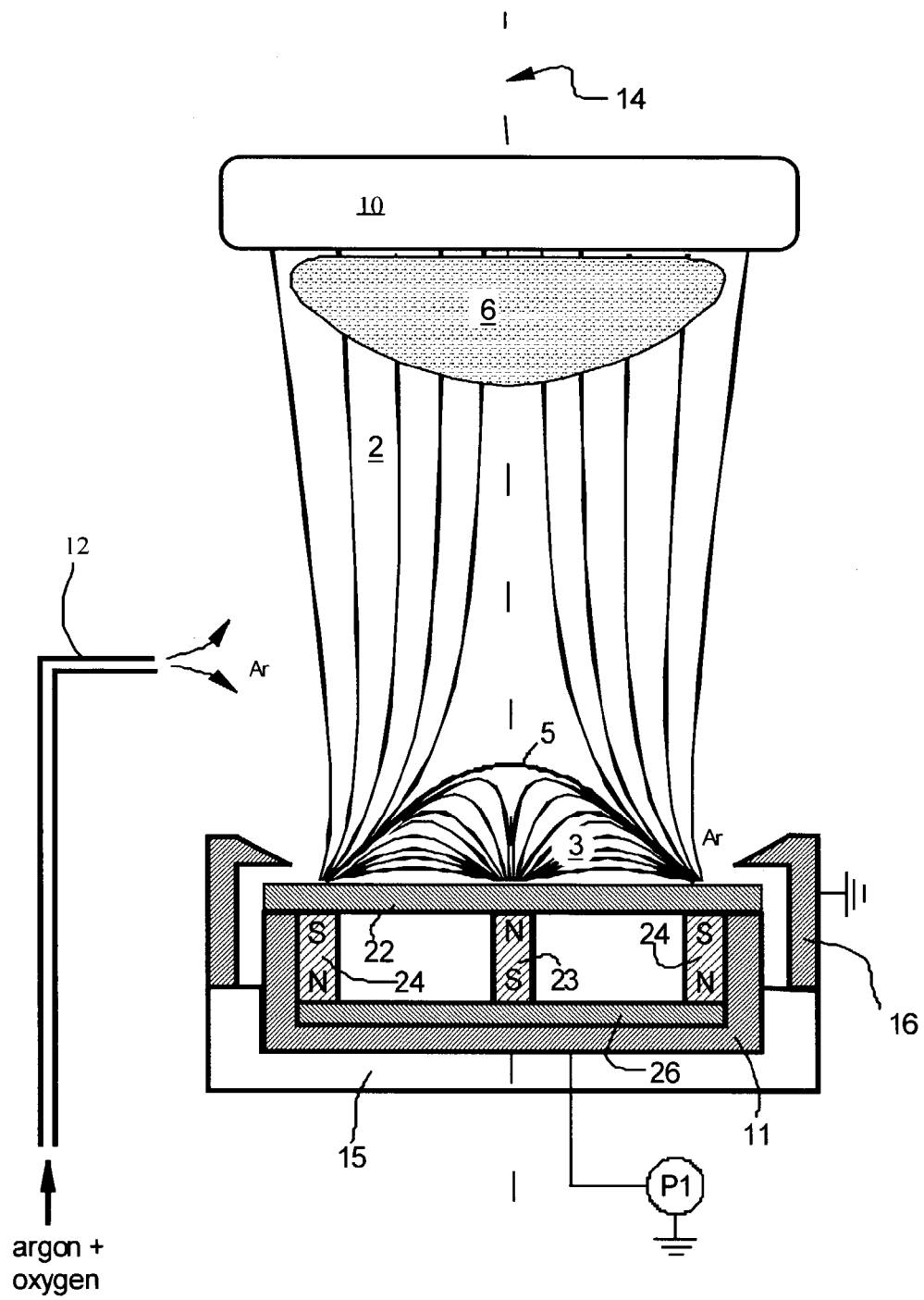
FIG. 1 is a sectional side view of a prior art "Type II" unbalanced magnetron, taken along a plane containing the axis of circular symmetry (14).

The most historically prominent example of a magnetic field used in the growth environment of a vapor deposition chamber is in the case the unbalanced magnetron (UBM). A circular unbalanced magnetron (UBM) source of the prior art is shown in FIG. 1, which is configured according to the principles of a "Type II" UBM, as introduced by Savvides and Window. The sectional view of FIG. 1 is taken along the axis of circular symmetry (14). The cathode structure of the magnetron comprises a sputtering target (22) that is fastened to a cathode housing (11). The prior art UBM sputter cathode, as with magnetron cathodes in general, possesses an inner magnetic pole piece (23) and a peripheral outer magnetic pole piece(s) (24) that are oppositely poled with respect to the sputtering target (22), thereby creating a set of magnetic field lines that terminate only at the cathode structure, forming a closed trap for confining a sputtering discharge over the target (22). The magnetic pole pieces (23) and (24) typically utilize permanent magnets, electromagnets, or various combinations of ferrous pole pieces and such magnets. The outer pole piece(s) (24) may comprise a single monolithic circular magnet, or several segmented magnets. Frequently a magnetic shunt plate (26) is employed, so that in the case of the "Type II" UBM of FIG. 1, the weaker inner magnetic pole piece (23) may comprise only an iron pole piece. The cathode housing (11) is typically electrically isolated, by an insulator (15), from a grounded sputter shield (16), which is typically utilized to prevent formation of unwanted discharges and to provide specific grounding characteristics for operation.

It may be noted, in FIG. 1, that the number of magnetic field lines emanating into the deposition space from the outer magnetic pole piece(s) (24) of the magnetron cathode is greater than the number of field lines emanating from the inner magnetic pole piece (23). Thus, some of the excess field lines will not be "closed" by terminating only at the other magnetic pole piece, but will instead intersect other surfaces within the deposition chamber. As those field lines that intersect the substrate are of primary interest in the present disclosure, only such lines are represented in the accompanying figures, where the substrate/fixture assembly (10) is located, substantially, in an on-axis position with respect to the UBM sputter source. The UBM trap region (2) of prior art UBM sources, whether "open" or "closed" has been used for the efficient ionization of gas/vapor atoms for ion bombardment of the substrate/fixture assembly (10). In this sense, the UBM magnetic trap (2) is used similarly to the magnetron discharge trap (3) of the magnetron discharge, as well as magnetic traps used in other deposition methods, such as activated reactive evaporation (ARE) processes, in that the desired and achieved effect is increased ionization of gas (or vapor) constituents. The magnetic field lines of the magnetron discharge trap (3) are separated from the field lines of the UBM trap region (2) by the zero-flux surface (5), which is the abstracted surface representing the division between the magnetron trap (3) and the EAD trap (2), and across of which exists no magnetic flux (Penfold). Note that the various magnetic field lines and zero-flux line become three dimensional surfaces when translated about the axis of circular symmetry (14). In the case of "Type II" UBM's, the grounded sputter shield (16) can not exist within the UBM trap region (2), since this would ground out the electrons and associated ambipolar plasma traveling along the intercepted field lines of the trap.

As is uniformly represented in the prior art of such "Type II" UBM devices, the confining nature of the extending field lines in FIG. 1 provides for formation of a bombarding plasma (6) in the on-axis space adjacent to the substrate/fixture assembly (10), to the extent that heavy ion bombardment of the depositing film is provided. It has been noted that the plasma (6) is highly non-uniform, and hence, produces a highly non-uniform deposition profile. This non-uniformity of the plasma bombardment is further exaggerated by the presence of electronegative species, such as oxygen, that are required in many reactive deposition processes, and may be produced and accelerated at the vicinity of the electrically negative surface of the sputtering target (22).

The substrate/fixture assembly (10) may incorporate a heating means for sustaining the substrate at elevated temperatures during deposition. As discussed in the prior art, the substrate assembly may incorporate various magnetic, ferromagnetic, and other means for additionally shaping the magnetic field produced by the unbalanced magnetron. Instead of the simple, planar substrate assembly of FIG. 1, substrate and fixturing may also be configured into various planetary and conveyer schemes for standard purposes of increased uniformity and efficiency.

Because the prior art UBM sources typified in FIG. 1 are most frequently utilized for the development of wear-resistant coatings, such as nitrides, carbides, and diamond-like carbon (DLC), reaction of the process gas with the sputtering target is normally viewed as acceptable. As such, sputtering gas and reactive gas are typically injected together, using generic injection means (12).

Figure 2:
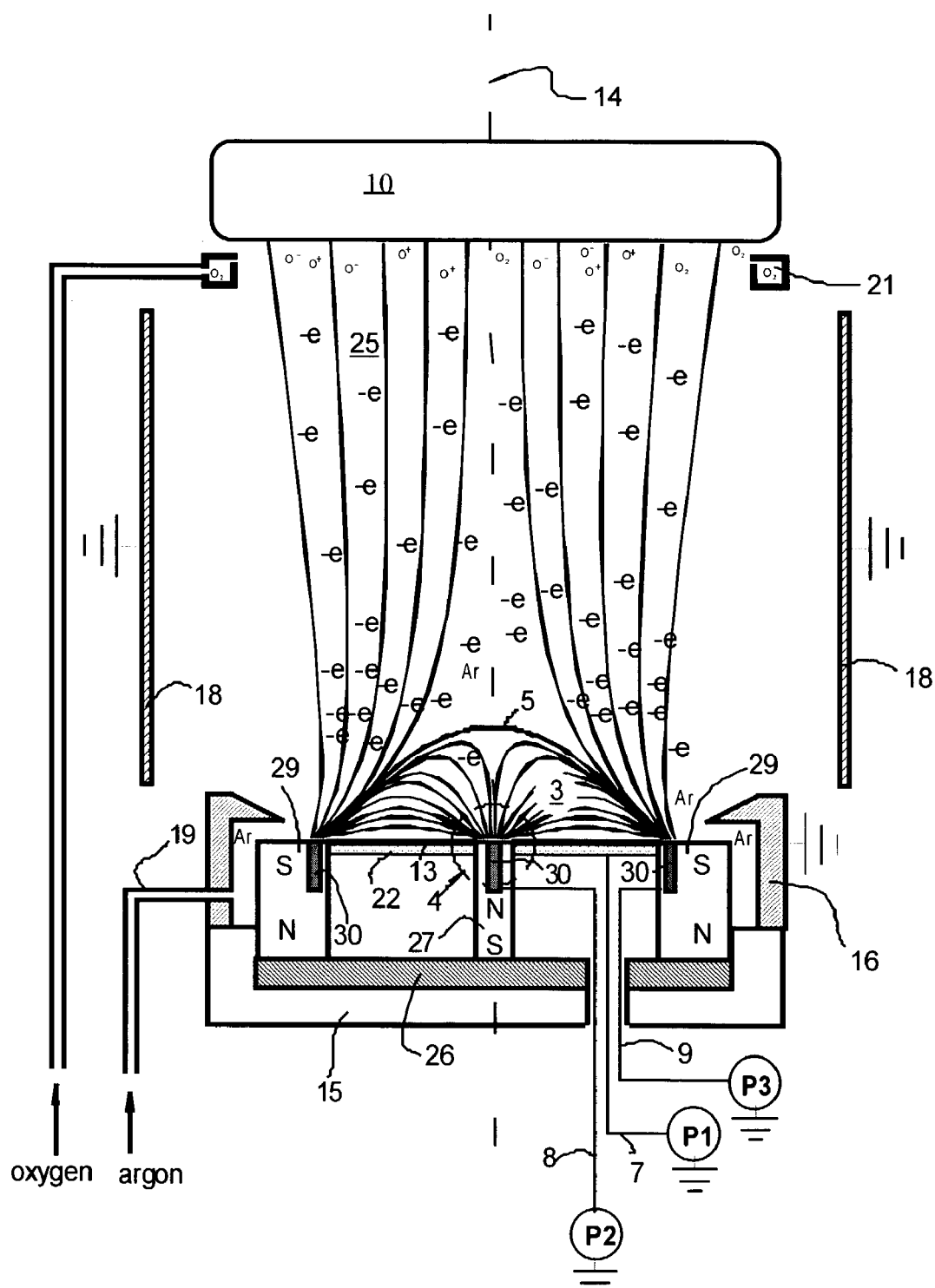
FIG. 2 is a sectional view of the disclosed sputtering apparatus in the first preferred embodiment, taken along a plane containing the axis of circular symmetry (14).

A first preferred embodiment of the disclosed deposition apparatus, in FIG. 2, utilizes a plasma sputtering source that incorporates elements of the conventional "Type II" UBM variety, as provided in the prior art in FIG. 1. However, because it operates according to fundamentally different principles, namely, those of an EAD process, than in the case of previous UBM sputtering apparatuses, the apparatus disclosed in FIG. 2 will herein be referred to as an UBM-EAD apparatus.

The EAD trap region (25) will refer, in the present disclosure, to a space containing magnetic field lines that generally terminate at the substrate/fixture assembly (10), and, in the case of the UBM-EAD apparatus, may be, similarly to FIG. 1, differentiated from the magnetron discharge trap (3) by the zero-flux surface (5). The field lines of the EAD trap region (25) indicate a magnetic field for trapping electrons to the degree that a state of saturation is achieved. The substrate/fixture assembly (10) in FIG. 2 is electrically floating, so that it may be electrically biased, and, in the preferred embodiment, is typically allowed to self-bias. Grounded chamber surfaces such as the grounded chamber elements (18) and grounded magnetron shield (16) at the periphery of the EAD trap provide the true anode for the EAD process and, as such, no grounded surfaces exist within the EAD trap region (25). As a result of this arrangement, electron current must flow across field lines to exit the EAD trap at its perimeter, so as to find the grounded surfaces. For the EAD mode to be properly established, the EAD trap must be homogeneously saturated with electron charge, or else growth conditions will revert back to those of plasma-type interactions, in that energetic ion bombardment of the substrate takes place. Because the mutually repulsive electrons flow from the center to the edge of the EAD trap, it is important that sufficient electron flux is introduced into the center region of the EAD trap, where it is intersected by the central axis of symmetry (14) in FIG. 2, so that this central region becomes saturated. Because the homogeneity of the EAD trap environment is not dependent on effects of ambipolar diffusion, but rather, on the mutually repulsive electron space charge, introducing the electrons in this center region will then result in electron space charge homogeneously filling the EAD trap as the electrons diffuse to the grounded surfaces (18, 16).

This latter condition of homogenous saturation is provided when the electrons, in FIG. 2, are emitted into the innermost field lines of the EAD trap (25), which correspond to the axis of circular symmetry (14) in FIG. 2. Injecting a flux of electrons into the central region of the EAD trap is accomplished, in the embodiments of FIG. 2, by integrating an electron source (30) into the magnetron cathode, namely, at the cusp regions of the magnetron trap (3). Thus, an electron source (30) is disposed so as to emit a high flux of electrons into field lines that are either tangential to, or within, the zero-flux surface (5). The most straightforward means of achieving this latter condition is to inject a high electron flux into the central cusp region (4) that corresponds to the termination of the magnetron discharge trap (3) at the cathode center. To this end, the inner magnetic pole piece (23) of the prior art magnetron in, FIG. 1, is replaced with a similarly poled inner magnetic assembly (27), in FIG. 2, that incorporates the electron source (30). It may be noted that the magnetic assemblies (27,29) in FIG. 2 comprise part of the exposed area of the magnetron cathode, so that electrons may be injected into the EAD trap. As a result of this geometry, the target (22) in FIG. 2 is constructed so as to accommodate electron sources (30), so that the exposed target area is limited only to those areas corresponding to the region of sputter erosion (13).

In the first preferred embodiment of the present invention, an electron source, powered by power source "P2" via connection (8) in FIG. 2, is integrated into the inner magnetic assembly (27), so that electrons are emitted into the field lines of the magnetron discharge trap (3). Alternatively, electron sources may also inject electrons into the central region of the EAD trap by placing such sources near the intersection between the zero-flux surface (5) and the magnetron cathode. The precise point of intersection of the zero-flux surface (5) and the cathode will depend upon various parameters, including target material and dimensions, magnetic design, etc. However, the points of intersection will typically lie along the inner edge of the outer magnetic assembly (29). The electron source(s) (30) may accordingly be, additionally or alternatively, integrated into this portion of the outer magnetic assembly (29), in FIG. 2, where the outer magnetic assembly would be similarly poled to the outer magnetic pole pieces(s) (24) in FIG. 1. In the present disclosure, therefore, reference to such magnetic assemblies (27,29) will refer to those magnetic assemblies that can incorporate an electron source (30).

The embodiments of FIG. 2 provide for separate electrical connections (7), (8), and (9), for the sputter cathode power "P1", inner electron source power "P2", and outer electron source power "P3", respectively. In some cases, such as when the electron sources utilize thermionic emitters, it may be possible for both electron sources and magnetron cathode to operate at the same voltage, so that they may be electrically connected, and the electron source connections, (8) and (9), provide only a biased current for heating the thermionic element of the electron sources.

It is normally preferable that the integrated electron source (30) be integrated into the inner magnetic assembly (27) of the UBM-EAD apparatus in FIG. 2. This central placement, first of all, will normally allow greater flexibility in the electron source design, as such things as efficient water cooling, electrical isolation, and uniform emission into the deposition environment, are more easily implemented. In addition, the weaker inner magnetic assembly (27) may, in some cases, comprise only a ferromagnetic material, which does not produce any additional magnetic flux, but rather, serves to appropriately shape the magnetic field. The desired interaction of the magnetic field with the electron source will vary with the specific choice of electron source. In general though, it may be seen that, in FIGS. 2–3 of the preferred embodiment, the electrons will interact with the magnetron discharge trap (3) at the cathode surface before proceeding into the EAD trap region (25).

Because the embodiments of FIG. 2 are particularly well-suited for reactive deposition processes, wherein reactive gases or vapors are used to provide a constituent of a deposited compound material, a preferred arrangement of reactive gas introduction means is provided by the reactive gas injection means (21). The sputtering gas is provided at the UBM-EAD source by an integrated injection line (19). Such a gas distribution geometry is useful for preventing reactive gases that are prone to forming negative ions from contacting the sputtering target.

Figure 3:
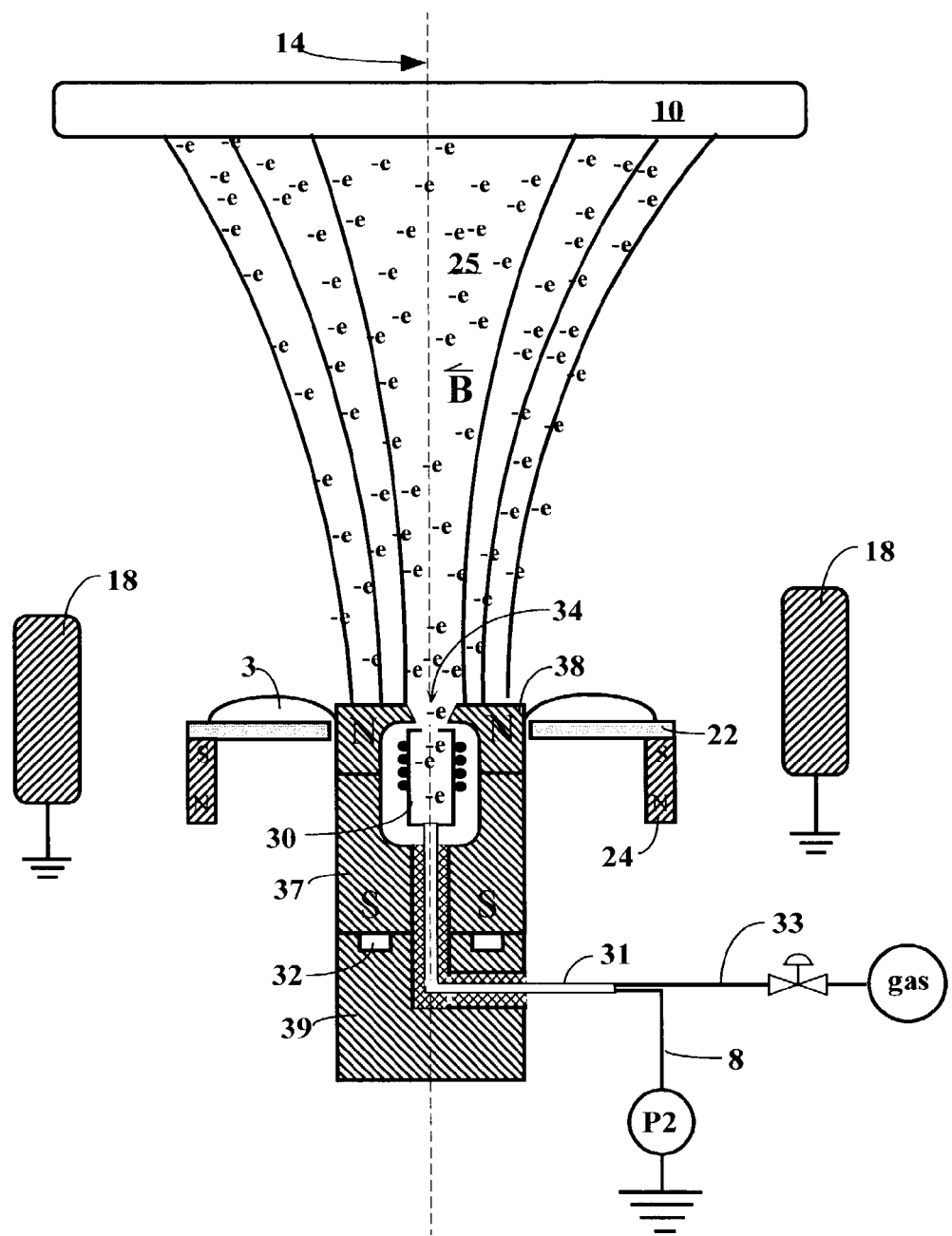
FIG. 3 is an enlarged sectional view of a magnetically trapped, hollow cathode electron source, in another preferred embodiment of the disclosed vapor deposition apparatus.

The integrated electron sources (30), in FIG. 2, may comprise one or more of the conventional electron emission means, such as a thermionic filament, a field emitter, (typically UV) light on a photoemitting surface, or one of various hollow cathode designs. However, the hollow cathode is preferred for its ability to produce very large electron currents. In FIG. 3, the structure housed by components (37), (38), and (39) are representative of the magnetic structure/electron source that may be used as either the inner magnetic assembly (27) and integrated electron source (30) or the outer magnetic assembly (29) and integrated electron source (30) in FIG. 2. An alternative embodiment of the invention is also provided in the embodiments of FIG. 3, in that, rather than providing the EAD magnetic trap (25) by the excess magnetic flux of the outer magnetic assembly of magnetron sputter source, as in the case of the UBM-EAD source in FIG. 2, one may also implement the EAD trap through use of a magnetron with a very strong inner magnet which provides flux lines that intersect the substrate. Once again, the grounded chamber elements (18) indicate that the electrons must exit the EAD trap before finding ground.

An effective means of introducing a high flux of electrons into a sputtering environment is through the use of hollow cathode devices, such as is taught by Cuomo et al, in U.S. Pat. No. 4,588,490, and included here by reference. It is noted, however, that the latter invention instructs placement of the hollow cathode at a position that is sufficiently removed from the target surface (more than 2–3 Larmor radii) so as not to interfere with the drift currents. This restriction is overcome to significant advantage in the present invention. By integrating hollow cathode sources within the magnetron sputtering cathode structure itself, one may still emit electrons into the closed magnetron field lines that sustain the sputtering discharge without impeding drift currents.

The hollow cathode (30) of FIG. 3 is of the variety that possesses a constricted emitting aperture for increased retention of electrons, or, in some hollow cathodes, increased retention of the discharge gas. The restricted aperture is also deemed preferable for avoiding redeposition of material from the sputtering target (22), on the hollow cathode interior. While the electron injection means may vary considerably, the housing structure of FIG. 3 defines an electron source aperture (34) for emitting electrons into the deposition environment. The housing piece (38) may then provide a bias voltage with respect to the hollow cathode (30). It may be preferable to introduce the sputtering gas through the hollow cathode, via feedthrough (31), which provides a conduit for both gas supply (33) and electrical power supply (8) to the hollow cathode. As will be discussed further, the electron source(s) for achieving the presently disclosed EAD process may be placed at a variety of positions in the magnetic field (s). The effectiveness of a particular hollow cathode used will depend, in part, upon its position within the magnetic field, the precise deposition process at hand, the process gases used, etc. In the case that the electron source of the disclosed apparatus is chosen to utilize a thermionically emitting surface, water cooling lines (32) are integrated into the housing to prevent undue heating of the surrounding structure.

Figure 4:
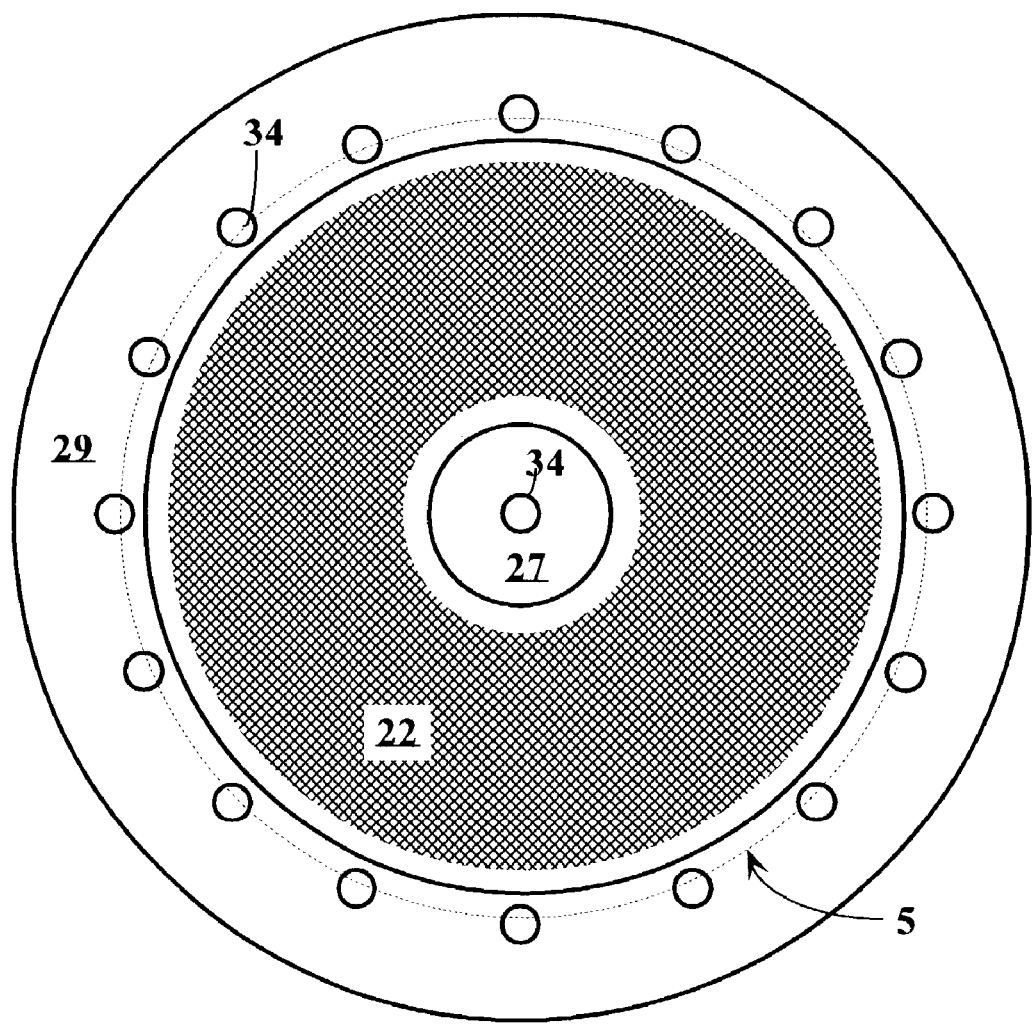
FIG. 4 is a top planar view of a circular magnetron cathode of the present invention, demonstrating preferred placement of the integrated electron sources.

FIG. 4 is a top view of the magnetron cathode, which comprises target (22), inner magnetic assembly (27), and outer magnetic assembly (29), with cross-hatched area indicating the sputtered region in FIG. 2. A suggested placement of electron source apertures (34) is also indicated in FIG. 4. The substantially unsputtered regions of the magnetron cathode surface may correspond to a continuation of the target material, or alternatively, to modular and electrically isolated pieces of the cathode assembly, which, as in the top view of FIG. 4, often has a circular aspect.

It is an option that the integrated electron sources be incorporated within the peripheral magnet assembly (29) in FIG. 2. It should be noted that this latter arrangement must provide electrons into the innermost magnetic lines emitting from the peripheral magnets, if electrons are to be coupled to the central on-axis region. As a result of this requirement, the electron sources apertures (34), when integrated into the outer magnetic assembly (29) should be placed so as to be adjacent to, intersecting, or within the circular intersection of the zero-flux surface (5) with the sputtering target (22). Of course, if the electron source is part of the target, or is fabricated from the target material, such limited sputtering bombardment is of little consequence. Because the outside edge of the erosion groove of the target will typically lie somewhat inside the inside edge of the peripheral magnet pole piece(s) (24), it is advisable, in this alternative embodiment, to place the electron source directly over the inside edge of the peripheral magnet assembly.

If the electron sources are not positioned so as to introduce electrons into the inner-most field lines that correspond to either the magnetron trap (3) or those lines tangential to the zero-flux surface (5), then the EAD condition may be expected to be compromised, with resulting ion bombardment and deposition inhomogeneity at the substrate. This requires, when injecting electrons with the outer magnetic assembly (29), that electrons be introduced close to the erosion track (13) of the sputtering target. Various theoretical means have been suggested for estimating the width of the erosion profile in magnetron sputtering sources; for example, Penfold estimates that the sputter-eroded area corresponds to the region of the magnetron trap (3) as defined in FIGS. 1–2. On the other hand, Lieberman estimates the erosion profile dimensions, more restrictively, as a relationship between electron gyration radii and the radii of curvature of the magnetron trap's field lines. Practically speaking, though, the perimeter of the erosion pattern will be found to vary considerably, depending on a variety of factors including the original thickness of the target, relative flux of inner and outer magnets, relative magnet height, the target material, etc., so that the erosion profile may begin well inside, at, or over the inside perimeter of the outer magnet assembly (29). Accordingly, the precise placement of electron source apertures (34) will depend on the geometry of the cathode and magnetic field, but the peripheral electron sources in the outer magnetic assembly (29) should, in general, be placed as close to the erosion pattern as is reasonably possible.

The precise electron current required will depend, to a great extent, on many factors of the specific process at hand, including the electrical properties of the deposited material, the deposition rate, the strength of the magnetic field, the size of the source, the precise partial and total pressures of the process, the ionization cross-sections of the gases used, and the physical location of the electron source(s). Generally, though, the required electron current may be expected to be in excess of 100 mA for even small EAD electron traps. Electron sources may be placed in any location that is appropriate for the specific chamber design used. Separate electron source modules may also be readily implemented for providing electrons to the magnetic field of the magnetron source in a configuration similar to previous magnetron deposition configurations, and may provide adequate electron injection for the purposes of the present invention.

Either permanent magnets or electromagnetic coils may provide the magnetic field. The substrate/fixture assembly (10), in FIG. 2, may also incorporate a material selectively composed to further shape or strengthen the magnetic field of the EAD trap (25). While the sputtering process and apparatus of the invention is disclosed, in its preferred embodiment, as a D.C. (direct current) sputtering process, it may be possible to utilize any of a variety of power sources for powering the sputtering discharge, while still maintaining EAD conditions. As is used generally in the art of sputter deposition, various embodiments of the disclosed invention might be powered by normal D.C., pulsed D.C., modulated D.C., low frequency R.F., high frequency R.F., or microwave powers; though, the use of high frequency power may incur difficulties due to efficient electron heating. The source may also be arranged with other sources using a bi-polar powering scheme, as has been popularly discussed and used in recent years. Likewise, the flux of deposited vapor may also be pulsed or modulated.

Figure 5:
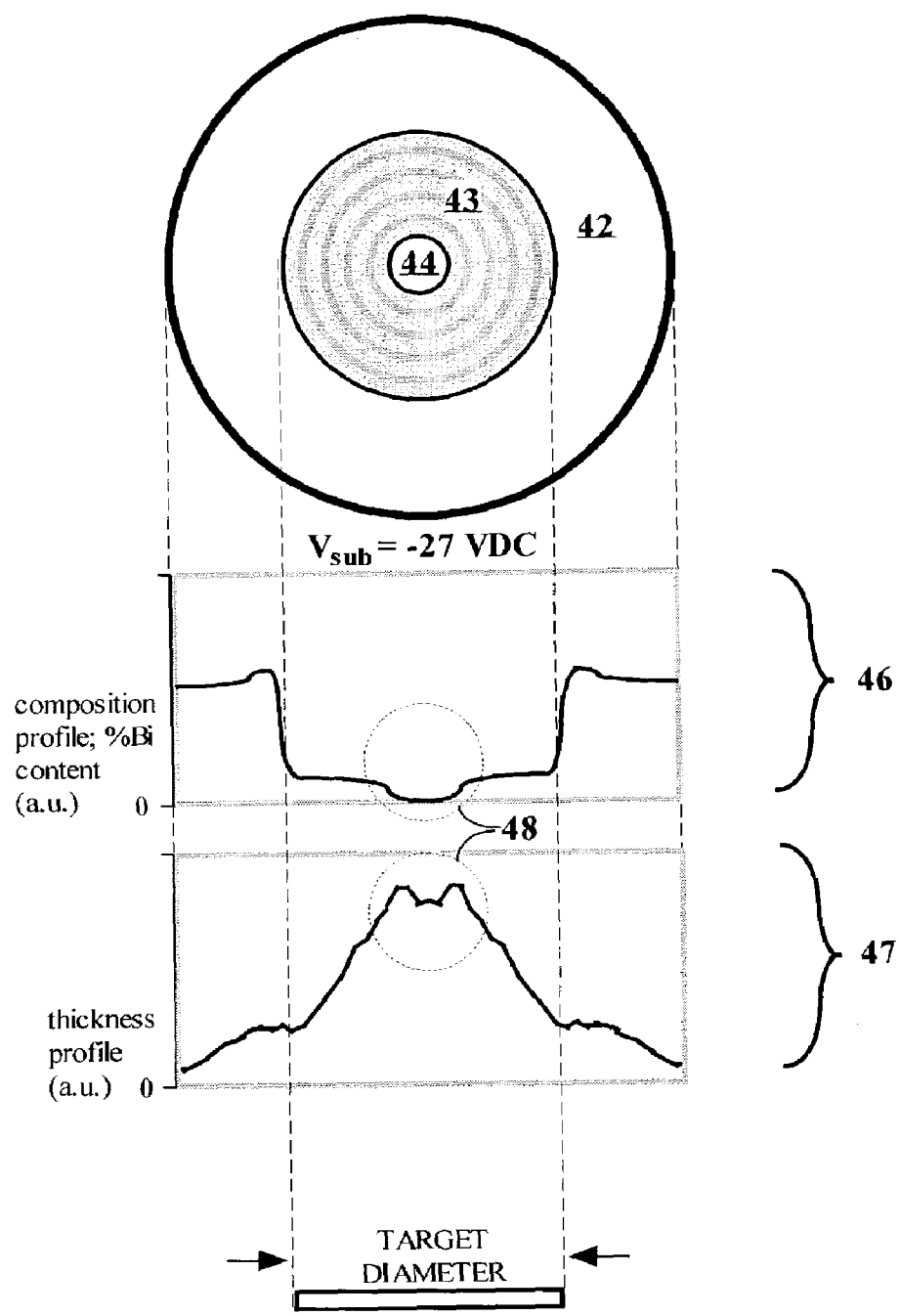
FIG. 5 is the typical on-axis deposition characteristics of a prior art "Type II" unbalanced magnetron. A top view of the coated wafer is presented with spatially correlated profiles. The upper profile is relative percentage (in arbitrary units) of bismuth in the deposited film as a function of the radial location on the wafer. The lower profile is the radial thickness distribution (in arbitrary units) of the deposited film.
Figure 6:
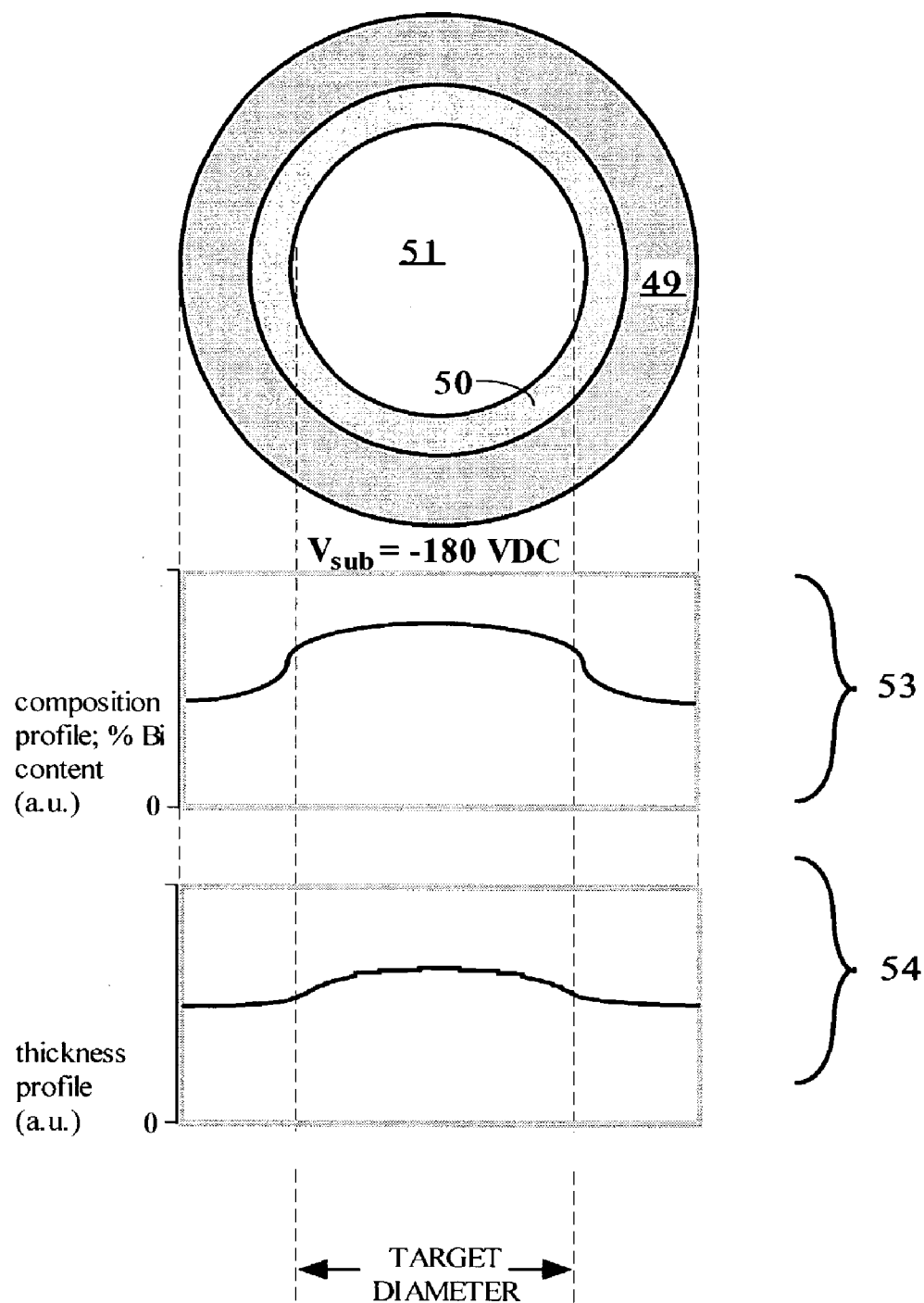
FIG. 6 is the deposition characteristics of the sputtering apparatus of the first preferred embodiment. A top view of the coated wafer is presented with spatially correlated profiles. The upper profile is relative percentage (in arbitrary units) of bismuth in the deposited film as a function of the radial location on the wafer. The lower profile is the radial thickness distribution (in arbitrary units) of the deposited film.
Figure 7:
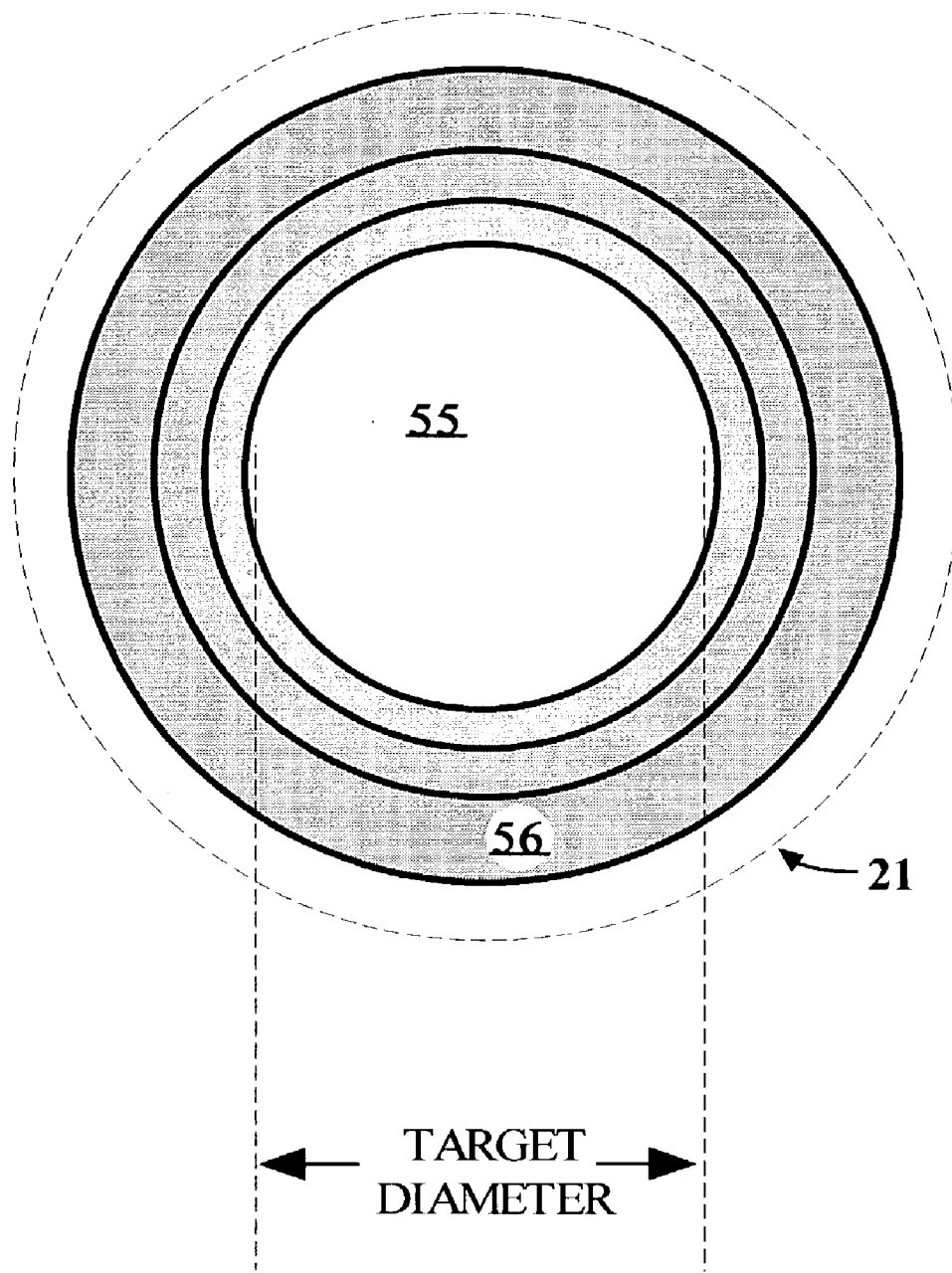
FIG. 7 is the reactive deposition characteristics of the disclosed sputtering apparatus in a normally reducing environment, wherein activation-limited film growth by the electron-assisted deposition process is demonstrated.
Figure 8:
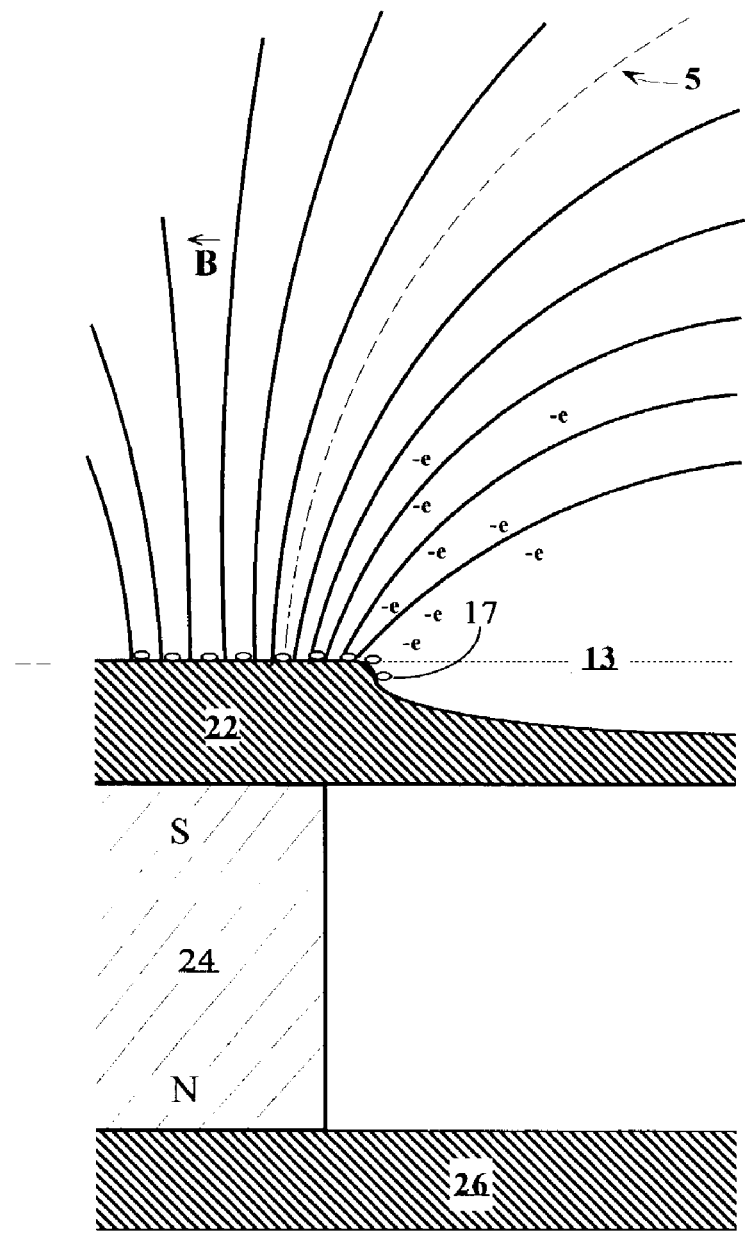
FIG. 8 is an enlarged and detailed portion of the sectional side view of the invention as disclosed in the preferred embodiments of FIG. 2, showing the alternative utilization of low-valence metals for production of excess electrons.

Experimental results by which the disclosed deposition process is characterized as a true electron-assisted deposition (EAD) process differentiate the disclosed invention from plasma-assisted or ion-assisted deposition (IAD) processes of the prior art. This is demonstrated, in FIGS. 5–7, through experiments conducted in the sputter deposition of a multi-component material that is very sensitive to ion bombardment and consequent re-sputtering of a volatile constituent from the growing film. Because of the high volatility and relatively low-magnitude heat-of-oxidation of bismuth, ferroelectric strontium bismuth tantalate (SBT) provided a suitable material for such a study. Any appreciable ion bombardment of the substrate will result in the deposition of bismuth-deficient films. The re-sputtering of Bi atoms from sputter-deposited SBT films is especially problematic at the elevated substrate temperatures, above 400° C., where the thin film depositions of FIGS. 5–7 took place. At these higher substrate temperatures, Bismuth is known to easily revolatilize from the growing SBT film. The strontium bismuth tantalate films in FIGS. 5–7 were deposited at a substrate temperature of 450° C. The deposition environments of both the prior art, in FIG. 5, and of the present invention, in FIGS. 6–7, are revealed in the spatial distribution of the resultant wafer surfaces, which are accompanied by both thickness and composition profiles in FIGS. 5–6. In FIGS. 5–7, the dimension of "TARGET DIAMETER" indicates roughly the area of the target that is within the inner diameter of the sputter shield (16). In one sense, the plasma sputtering apparatus of the first preferred embodiment may be described as a modification of the "Type II" UBM's of the prior art. However, these previous UBM sources are characterized by dramatically different operating characteristics. The deposition characteristics of prior art unbalanced magnetrons of the general "Type II" magnetic field geometry, utilized in the preferred embodiment, are represented in the various embodiments of FIG. 5, wherein typical results of substantially on-axis sputtering with such prior art UBM sources are displayed. A primary characteristic that is attributed to these prior art "Type II" UBM's is heavy plasma bombardment, which may be witnessed, in FIG. 5, in the almost complete depletion of the easily resputtered bismuth atoms from the film in the on-axis sputter region (43, 44), this, with a self-bias potential of −27 VDC for accelerating positive ions in the ion sheath. One may note that outside of the on-axis region corresponding to the UBM trap (2) in FIG. 1, the resputtering of the volatile component from the growing film is significantly less, so that the off-axis region (42) of the deposited film in FIG. 5 contains significantly more bismuth.

A second general characteristic attributed to these prior art on-axis deposition processes is a very non-uniform deposition rate with respect to radial distance from the target's central axis. Such non-uniformity in UBM deposition is typically found to be significantly greater than in the case of "balanced" magnetrons, due to inhomogeneity in the UBM plasma environment. These characteristics of resputtering the deposited film and a non-uniform rate of deposition are represented in the two profiles of FIG. 5.

In particular, a characteristic that occurs in oxide deposition processes of the prior art UBM sources, generally represented in FIG. 5, is the development of significant fluxes of negative oxygen ions. These negative ions contribute significantly to the formation of beam-like plasma bombardment of the substrate. The central dip (48) in the thickness profile (47) in FIG. 5 is not due to the erosion profile of the sputtering target, but is due rather to such beam-like bombardment and resputtering of the substrate. This bombardment may be witnessed as well in the equivalent region of the composition profile (46), wherein the relatively volatile bismuth is substantially absent from the film composition. The resputtering evident in the central region (44) in FIG. 5 is frequently even more severe in such processes, such that, rather than material deposition, sputter etching of the substrate occurs.

Such heavy plasma bombardment, and the accompanying spatial inhomogeneity of both growth rate and composition, found in previous on-axis "Type II" UBM processes, has precluded their use in such high tolerance, damage-sensitive applications, such as in the growth of epitaxial films, or multicomponent oxides such as ferroelectrics, piezoelectrics, pyroelectrics, or High-$T_c$ superconductors.

The operational characteristics of the sputtering source of the preferred embodiment are represented in FIG. 6, wherein the resultant film properties may be contrasted to those of FIG. 5. Of primary importance is the relationship between the percentage of Bi incorporated into the deposited film, and the introduction of excess electrons into the on-axis deposition environment. The re-sputtering of Bi atoms from the growing film is effectively reversed from the case of the prior art, in FIG. 5. In fact, as witnessed in the composition profile (53), it is noted that the Bi percentage in the on-axis region (57) of the deposited film, in FIG. 6, is actually increased over the less bombarded areas of the wafer's edge region (49). It is understood that the incorporation of the volatile Bi metal atoms in the on-axis region (57) is actually increased over that of a balanced magnetron process. In this way, the composition of the source material is more faithfully reproduced in the deposited film.

It should also be noted that the electrically floating self-bias, during deposition, of the prior art in FIG. 5, was −27 V, whereas that of FIG. 6 was −180 V. Substrate self-biases higher than −200 V have also been witnessed. Such a large increase in the substrate self-bias would be interpreted, in the prior art, as a commensurate increase in the energy of positive ions that bombard the substrate. With any reasonable, or previously recorded plasma potential, such a −180 V bias at the substrate would result in heavy ion bombardment, of energy more than sufficient to resputter the bismuth in FIGS. 10–11. However these self-bias voltages are not acceleration potentials with respect to an adjacent plasma potential. This may be explained by the fact that such assumptions of conventional plasmas, such as those of ambipolar diffusion, are not adequate to describe the presently disclosed EAD process. As such, the local environment of the substrate may be better described in terms of a magnetically confined electron gas.

It is also noted that the increased self-bias voltages witnessed in the disclosed invention are not due to the capacitive effects that are reported in pulsed or alternating-current plasma discharges, as have been witnessed in prior art sputtering experiments. Instead, the increased self-bias potentials possible in the present invention may be obtained utilizing only true, unswitched, D.C. power.

Whereas, for purposes of disclosing the invention, the substrates in FIGS. 5–7 were insulated from ground and allowed to electrically float at the self-bias potential incurred by the EAD process, it is not necessary for the substrate to float at the self-bias potential. Various electrical biases might be applied to the substrate for promoting certain types of growth; insofar as damaging ion bombardment is not created at the growing film.

An additional important development, in FIG. 6, of the disclosed EAD process is the improved homogeneity of growth rate as a function of radial distance from the target center, as witnessed in both the composition profile (53) and thickness profile (54). It may be noted that, despite any radial electric field that may exist within the on-axis area (51), the deposition characteristics are nonetheless spatially uniform in this area, with the primary transition in deposition characteristics occurring in the edge region (50) of the EAD trap region (25), which marks the region of the magnetic field where electrons trapped along magnetic field lines, in FIG. 2, begin to be grounded out by the sputter shield (16).

The utility of increased activation of the growth interface, in the disclosed electron-assisted deposition process and apparatus, is further revealed in the establishment of an activation-limited growth process, as is illustrated in FIG. 7. Whereas the growth profiles in FIGS. 5–6 are obtained from deposition environments utilizing sufficient partial pressures of oxygen to deposit fully oxidized films over the entire substrate fixture, the deposition environment of the SBT film in FIG. 7 is characterized by an unusually low flow rate and partial pressure of oxygen. FIG. 7, which is a fused silica substrate coated with the disclosed deposition process, using an unusually low reactive gas (oxygen) flow and partial pressure (<0.25 sccm and <0.1 mTorr), with a total pressure of 2 mTorr. This low oxygen partial pressure and flow rate is inadequate for depositing a stoichiometric oxide film in the same chamber configuration using a prior art sputtering source for reactive metal target sputtering. The film deposited by the prior art sputtering source is essentially identical to the outer region (56) of FIG. 7, which is completely opaque, indicating a severely reduced oxygen content. Using the same chamber conditions and deposition rate with the EAD process and apparatus of the present invention, the resulting deposited film, in FIG. 7, displays a well oxidized, transparent region (55), which corresponds to the on-axis trap region (25) above the target in FIG. 2 of the invention. It is noted that the oxygen is actually injected to the substrate at the location of peripheral gas injection means (21), in FIG. 2. Thus, although the oxygen is admitted, and most abundant, at the periphery of the substrate, the region of the substrate that is oxidized corresponds to the inner region that is exposed to the high electron flux.

In terms of thin film growth, the domination of surface chemistry in determining the growth mode in this EAD process further blurs any fundamental delineation between metallic-mode reactive sputtering processes and plasma-enhanced, low-pressure CVD. At the point that complexed precursor gases are used in such an EAD process, such delineation will be even less distinct. From a CVD point-of-view, the EAD process disclosed cannot be viewed in the traditional sense of either an "adsorption-limited" or a "diffusion-limited" process, as the limiting mechanism for film growth is actually the absence of electron bombardment. Therefore we have found the positive identification of an electron-assisted deposition process. That positive identification is found in the observation of an activation-limited growth mode, wherein high negative potentials at the substrate do not produce the corresponding re-sputtering action of positive ions accelerated through a plasma sheath. Bismuth and oxygen remain on the substrate, in FIG. 7, only when the growth front of the film is activated by electron bombardment, so that the probability of forming the more stable bismuth oxide is dramatically increased. Thus, as is also suggested in the embodiments of FIGS. 6 & 7, the effective sticking coefficient of a volatile metal in a multicomponent film is significantly increased, due to electron assistance, by more readily reacting to form a less volatile compound. Because of this electron activation, the stoichiometry of the metal target is substantially replicated in the composition of the deposited compound film, as the various sticking coefficients of the disparate elements become more equalized under the electron activation. In other words, the presence of the magnetically trapped electrons of the invention also effectively increases the sticking coefficient of volatile elements. Such electron activation of the growth front thus allows for the resultant film composition to be less dependent on the particular local chemistry of the underlying substrate, so that substrates with spatially heterogeneous properties may be coated more uniformly.

This latter point is especially apparent in FIG. 7, due to the compositional profile of the deposited film, which once again demonstrates that the inner transparent region contains the bismuth content required in the SBT phase, whereas the reduced outer region (56) of the deposited film is a reduced combination of tantalum and strontium sub-oxides. Thus, a conclusion of FIG. 7 is that the EAD environment in the on-axis environment of FIG. 7 has effectively increased the oxygen-gettering of bismuth to exceed that of tantalum in the un-assisted outer region.

Another conclusion that may be drawn from FIG. 7 is that less reactive gas is required in the EAD environment to achieve a fully reacted film, and thus, less of the reacted gas may be made available to poison a metal sputtering target used for depositing the film. Because of this ability to run in a metallic mode wherein only the deposit at the substrate is non-metallic, the disclosed apparatus and process provide a means of achieving a reproducible and stable metallic-mode process. Such a stable metallic-mode process, combined with the improved replication of the target composition, is highly desirable for deposition of multicomponent oxide materials from a single metal target. This ability to replicate the target stoichiometry is, in part, due to the prevention of high energy negative ions being formed through contact of the reactive gas with the target surface.

Various means for providing high electron flux into the EAD trap may be utilized in place of the modular electron sources previously discussed. In some cases, such as those in FIG. 8, in which the sputtering target (22) contains certain group I or group II metals, the secondary electron coefficient of the target surface can be high enough so that a slightly oxidized, or otherwise poisoned, portion of the target becomes a very efficient electron emitter. Such an efficient electron-emitting surface will develop when the target is a metallic target containing a group I or group II metal, and a reactive gas such as oxygen (or fluorine, or nitrogen) is used to form a compound film. In the case of these highly reactive metals, even a metallic mode sputtering process will result in oxidized metal atoms (17) forming at the relatively unsputtered regions of the target. Because these less sputtered regions will also correspond to the magnetic cusp regions discussed above, such poisoned surfaces become an excellent means of emitting secondary electrons into the magnetic field, even though the target is operated in metallic mode, wherein the eroded area, as indicated by sputtered region (13) in FIGS. 2 & 8, and by the cross-hatched area in FIG. 4, remains metallic. Additional target poisoning, as practiced in the disclosed invention, will also produce efficient electron emission from the sputtered portion of the target's surface, to substantially the same effect.

It is well known that metal oxides frequently possess secondary electron coefficients significantly higher than that of the corresponding metal. It is also known that certain group I and group II metals, such as magnesium, form metal oxides of unusually high secondary electron coefficients. While there are large discrepancies between measurements of these coefficients, it has been found that the coefficient of MgO can increase markedly for a vacuum-cleaved surface. It has been discovered in the present invention that such group I and group II metal oxides as MgO, BaO and SrO can produce an unexpectedly large flux of electrons when existing at the surface of a metal target, in the plasma environment of the sputtering source. The magnitude of the resultant electron flux may be witnessed to establish the EAD mode of operation disclosed herein. It may be noted that emission of electrons from the sputter-eroded area of the target (13) will also provide electrons centrally to the trap region (25).

While some oxidation of the target surface may be found useful in creating secondary electrons, it is not necessary that the sputtered portion of the target surface be "poisoned" in the traditional sense. That is to say, very little oxidation need occur at the target to substantially increase electron emission. As such, the deposition rate may still correspond to the high-rate, un-poisoned, region of the sputtering target's hysteresis curve. Also, because the target is, in FIG. 8, preferably an intermetallic including a Group I or Group II metal, oxidation of discrete atoms of the one component will not result in the sputter yield of the component being reduced to that of its corresponding oxide, such as would occur in phase segregated targets. In particular, targets comprising certain intermetallics that include such group I and II metals as Cs, Sr, Mg, La, Be, Ba, and Rb, can be found to be ionic enough in character to provide the necessary high-$\gamma$ emission of the EAD process of FIG. 8.

What is required to sufficiently enhance electron emission into the trap region will depend on the particular materials and processes used. While the coupling of electrons into the magnetic field may be accomplished by any appropriate means, it is noted that the operation of the disclosed vapor deposition apparatus in the low pressures and selected gas-flow geometries of the preferred embodiments, below 3 mtorr and in metallic mode, allows for more liberty in the selection of certain electron sources. This liberty is provided by the ability to maintain the immediate environment of the electron source at a lower partial pressure of oxygen, or other damaging reactive gas, used in forming the deposited compound.

For example, thermionic electron emission, which requires a heated surface, is usually impractical in partial pressures of oxygen greater than $10^{-4}$ torr. However, because of the enabling of a very metallic mode of reactive deposition, a thermionic surface at the sputtering cathode may be operated with a substantially longer lifetime and more stable performance. Thus, because of the efficient use of reactive gas at the substrate, provided by the EAD characteristics, electron sources that would be otherwise difficult to use in reactive processes may be readily implemented in the disclosed apparatus and process. Using chamber pressures below 3 mtorr, in the present EAD process, is also preferred for substantially avoiding the production of high-energy reflected neutrals and other plasma species that may damage the growing film.

While the present disclosure has taught the invention, in FIGS. 2–8, within the context of an unbalanced magnetron apparatus, the disclosed EAD apparatus and process may be implemented in conjunction with a variety of vapor deposition approaches without departing from its principles or scope. The alternative embodiments of FIG. 9 serve to provide alternative means of implementing the disclosed deposition apparatus and device. As previously noted, the electron source means of the present invention may be provided by any of a variety electron source means. The use of ultraviolet radiation incident on the target itself, as disclosed in U.S. Pat. No. 4,664,769 to Cuomo, and included here by reference, may also comprise the electron source means of the present invention, as in FIG. 9.

Figure 9:
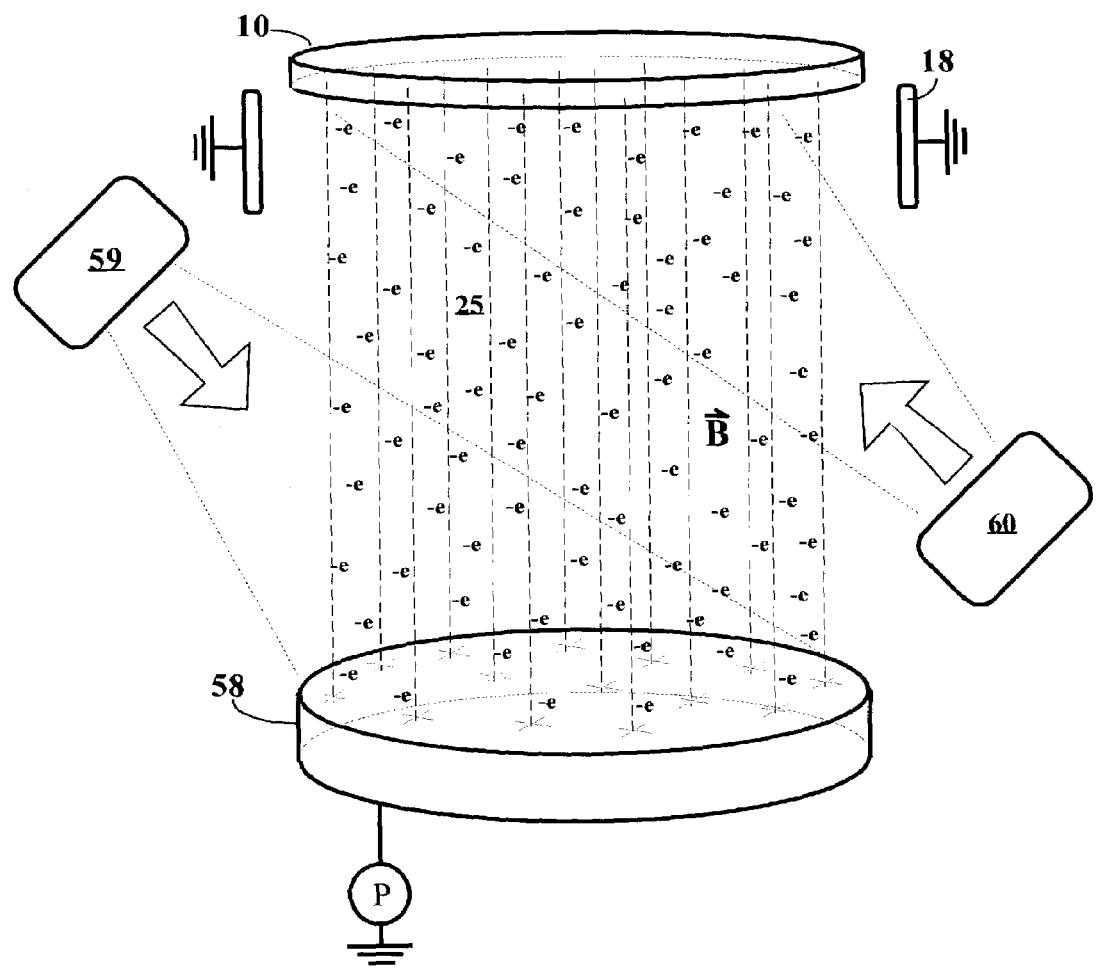
FIG. 9 is a perspective view of an alternative magnetic field configuration in the invention.
Figure 10:
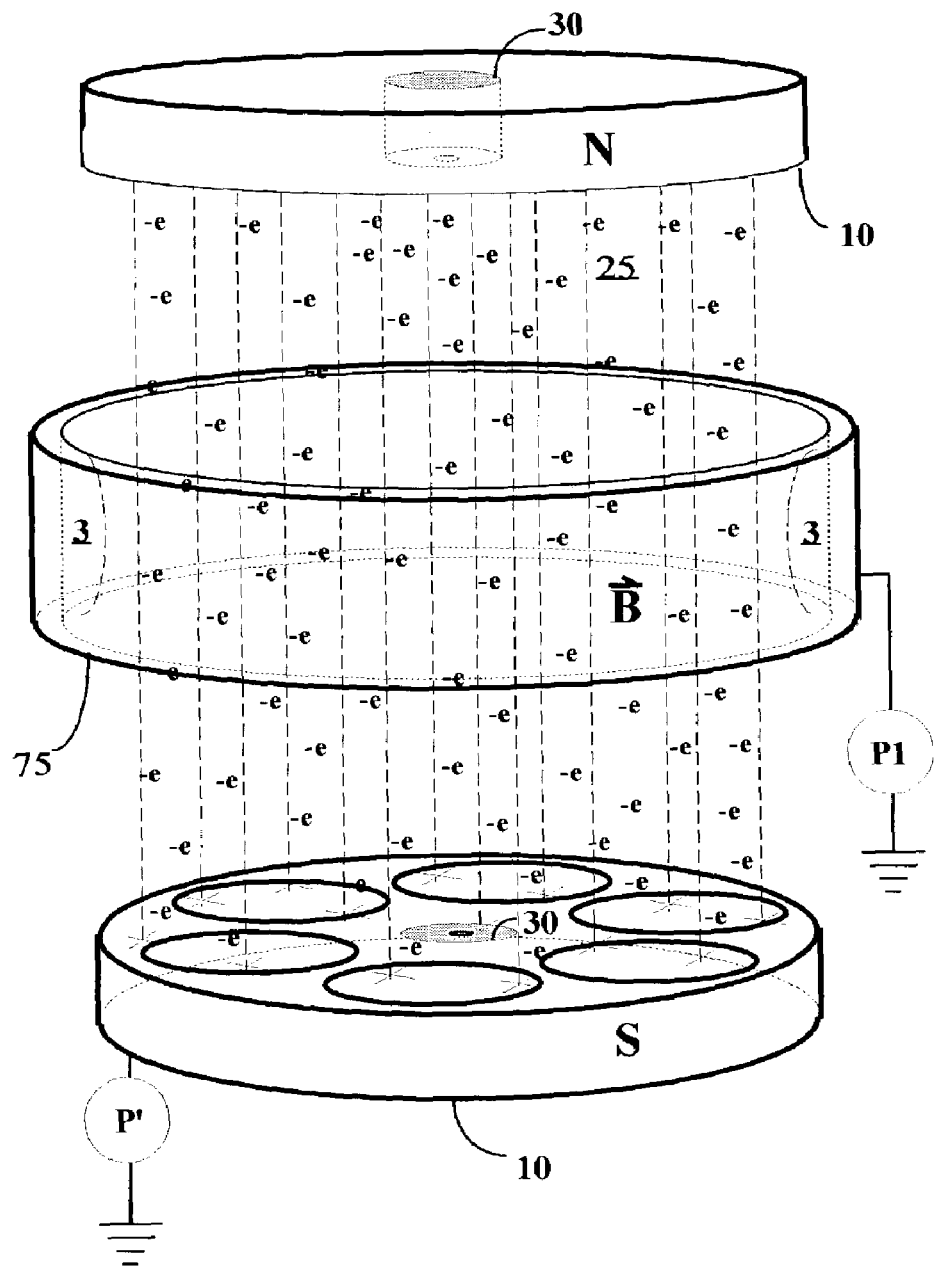
FIG. 10 is a perspective view of an alternative embodiment of the disclosed vapor deposition apparatus and process, wherein a modified hollow magnetron source is disclosed.

Accordingly, an ultraviolet radiation source (59) may be directed at a negatively-biased metallic surface (58) that comprises one of the first and second surfaces that terminates the EAD trap region (25). In the embodiments of FIG. 9, this biased metallic surface (58) is biased by a power supply, 'P', which provides the electrons that are photo-emitted into the EAD trap. While this biased surface (58) may also contain means for providing a vapor to deposit on the substrate/fixture (10), a depositing vapor is also provided by an external vapor source (60), which is external to the EAD trap (25). This external vapor source may comprise any of a variety of prior art vapor sources, such as a kaufmann ion source, cluster-ion source, fast atomic beam source, evaporation source, etc.

While many of the benefits of the present invention may be realized in a wide range of operating pressures, the benefits of the invention are best realized, in its preferred embodiment, with pressures approaching or within the collisionless sheath pressure region, typically less than 3 millitorr. This preferred pressure range best allows operation of an unpoisoned target, and, using the recommended gas geometry, avoids production of damaging negative ions. In addition, this lower pressure region also appears to reduce damage due to high-energy reflected neutrals.

In addition to the substantially planar sputtering apparatus of the preferred embodiments, as disclosed in the previous discussion, the EAD process may also be implemented into other, reactive or non-reactive, physical vapor deposition processes. For instance, the magnet and sputtering target configuration may alternatively be that of a linear magnetron or a hollow magnetron. While the case of a linear planar magnetron may be easily extrapolated from the case of the circular planar magnetron, a modified hollow magnetron geometry, FIG. 10, allows several unique advantages. One such advantage exists in the utilization of substantially the same magnetic field vectors for both guiding of the electrons and confinement of the sputtering discharge at the cylindrical target surface (75). The cylindrical target surface may that of any of a variety of hollow magnetron designs that provide a magnetron trap region (3) that is compatible with the EAD trap of FIG. 10. As such, the first and second terminating surfaces in FIG. 10 may both be a substrate/fixture assembly (10), which each incorporate means—such as large magnets—for providing the opposite poles of the EAD trap. Also, the electrons of FIG. 10 may be provided into the magnetic field by one or more electron emitting apertures (34) located in either of the surfaces that terminate the EAD trap (25). The electron sources may comprise any of those previously discussed.

Figure 11:
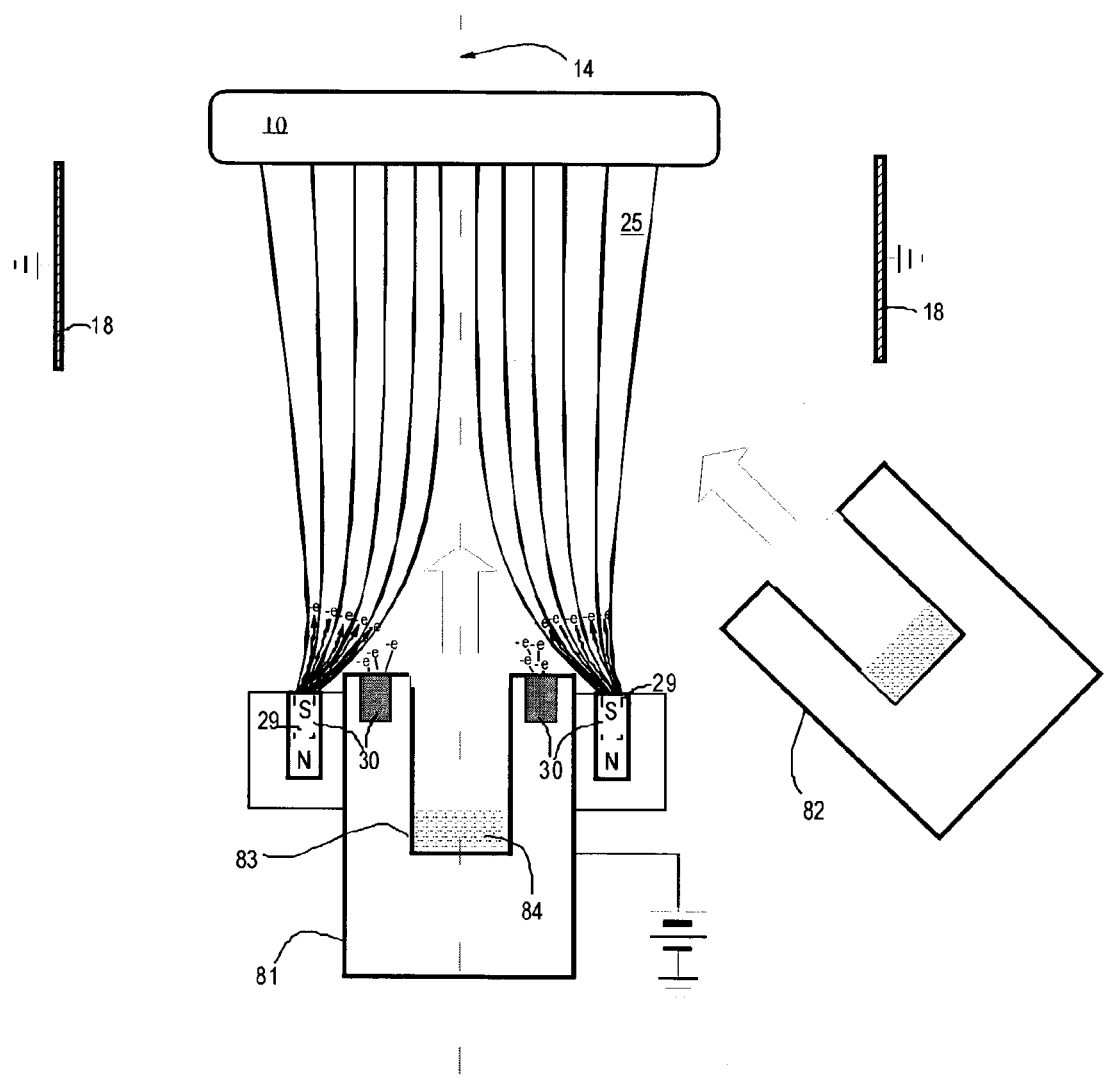
FIG. 11 is a sectional side view of an alternative embodiment of the disclosed vapor deposition apparatus and process, wherein a modified effusion cell is disclosed.

The novel features of the present invention provide advantages in a variety of vacuum deposition processes, which may incorporate any compatible means of condensing a vapor onto a workpiece. As such, the EAD trap (25) may be utilized in conjunction with a generic central vapor source (81) that may be electrically biased to prevent electrons from exiting but may also utilize any of the vapor sources of the prior art that are compatible with the low transition-flow and molecular-flow pressures needed to achieve the EAD conditions. Such vapor sources might include those of various e-beam and boat evaporation methods, as well as the various vapor injection sources utilized in low-pressure CVD. For example, rather than using a plasma sputter source, one could implement the same features of the disclosed magnetically confined electron source into an evaporation process. Such a configuration, in FIG. 11, is illustrated herein using an effusion cell (83). As in the previous drawings, only the magnetic field lines intersecting the substrate are shown.

It will be noted that the invention need not be implemented as a symmetrical arrangement, since a vapor source may introduce a depositing vapor from a location and direction different from that of the EAD trap. For example, a second effusion source (82) is place asymmetrically to the EAD trap (25) in FIG. 11. Similarly to the metallic mode sputtering process described in conjunction with FIG. 2, the EAD apparatus of FIG. 11 may be implemented so as to allow lower oxygen (or other reactive gas) pressures, thereby preventing oxidation of the source material (84).

While the preferred embodiment of the disclosed deposition process utilizes a magnetically confined sputtering plasma and a sputtering target, the requirements of the condensable vapor source could also be satisfied by a rather wide variety of sources. In this latter sense, the vapor source of FIG. 11 could comprise any means of providing a vapor, as long as such means does not interfere with the operation of the EAD trap. Such a vapor might comprise a pure elemental vapor, or a complexed precursor gas that is to be disassociated at the substrate.

Figure 12:
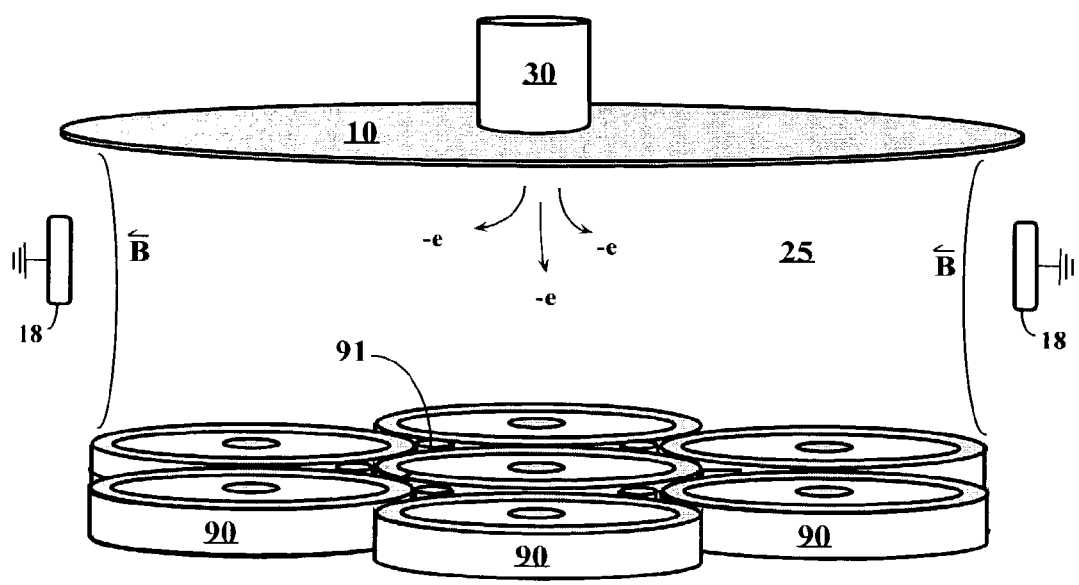
FIG. 12 is a perspective view of an alternative embodiment of the disclosed vapor deposition apparatus, utilizing multiple sources in a single deposition process.

The vapor deposition processs and apparatus of the preferred embodiments, FIGS. 1–11, may be used alone, in sequence with other processing steps, or combined with other deposition or etching tools in a single process. One such possibility is to arrange several of the sputter deposition sources disclosed in FIGS. 2–7 in a single deposition station. The latter arrangement would be well suited for coating large articles, such as larger wafers. In the geometry of FIG. 12, seven of the disclosed magnetron cathodes (90), which would each comprise the magnetron cathode elements described in FIG. 2, are placed in an interconnected hexagonal arrangement. The interstitial areas between the cathodes may then house additional electron and/or reactive gas emission means in interstitial modules (91). Because there should be no grounded surfaces present in the EAD trap (25) of FIG. 12, these interstitial modules are negatively biased with the cathode potential. As a result, these interstitial modules provide an effective means of manipulating electron and gas flows within the larger EAD trap (25a) that results from several smaller EAD traps being joined together in the manner of FIG. 12. Such an arrangement may provide advantages in large-area deposition equipment. Also, because of the low total pressures and partial pressures of oxygen use, ballistic oxygen atoms may be emitted toward the substrate/fixture assembly (10) from one of these interstitial modules, while the target remains shadowed and, hence, in a relatively metallic state. One may also, or alternatively, incorporate additional electron sources (30) into the substrate/fixture assembly for saturation of the EAD trap.

In addition, the geometry of FIG. 12 avoids the difficulty and expense incurred in producing homogenous, high-tolerance single targets for such large deposition areas; an especially important advantage in view of the more recent sets of exotic metals and ceramics being investigated for thin film materials.

Figure 13:
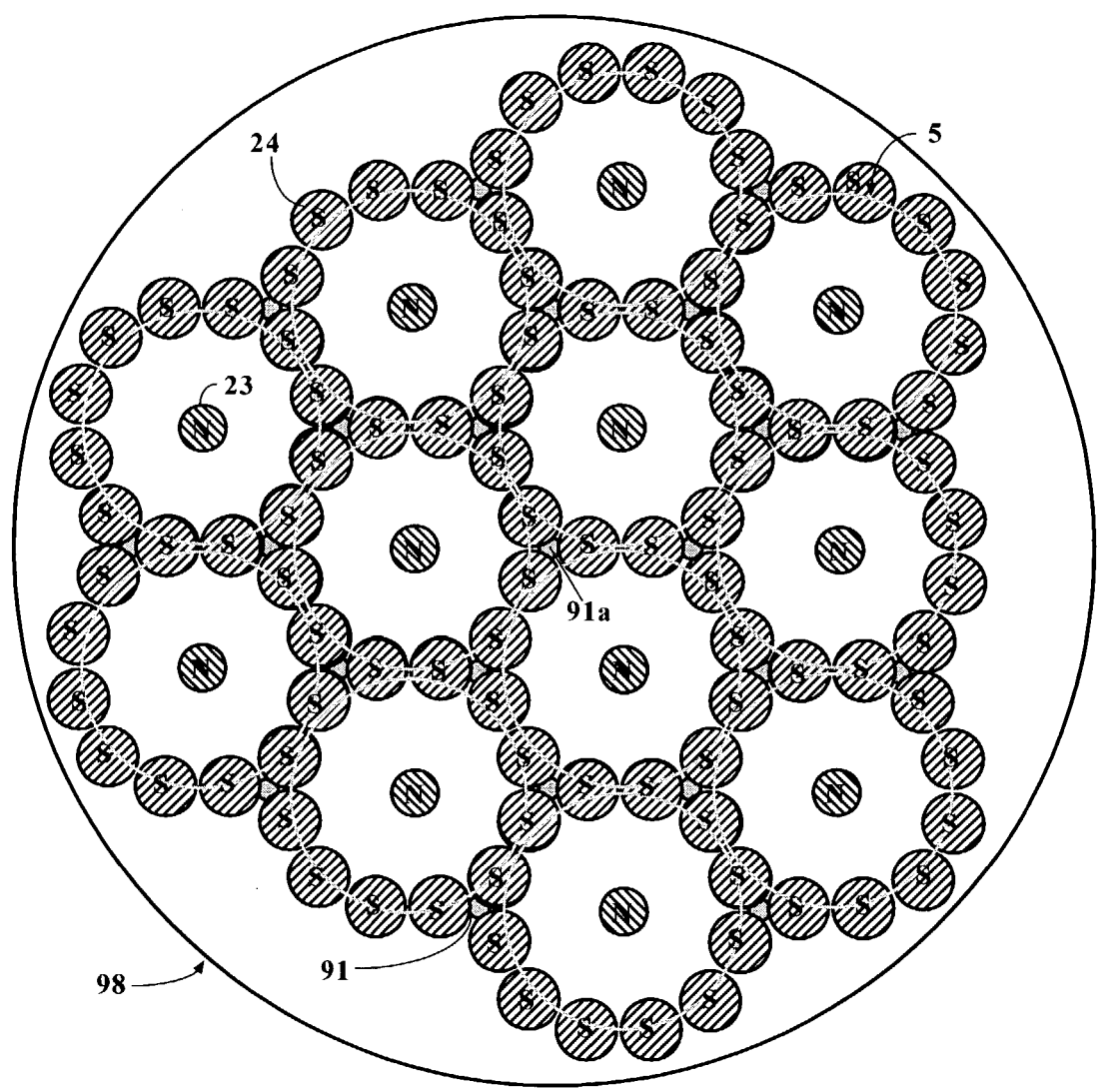
FIG. 13 is the top view of an alternative configuration for placement of pole-pieces and electron sources in FIG. 12.

A novel arrangement of magnetic pole pieces, in the top view of FIG. 13, allows for an alternative hexagonated arrangement of sputtering magnetron discharges, wherein, rather than the separate magnetron cathodes of FIG. 12, a single cathode housing (98) incorporates an arrangement of outer magnetic pole piece(s) (24)—all the "S" pieces—that provides separate magnetron traps and EA FIG. 2, except that the plurality of EAD traps, provided by the arrangement of FIG. 13, is, similarly to FIG. 12, sufficiently interconnected to mutually trap electrons in the resulting larger EAD trap. For example, electrons injected toward the substrate from the particular interstitial module (91a) will be trapped within the assembly of EAD traps. The inner magnetic pole pieces (23) may then be simple magnets as in the prior art magnetron of FIG. 1, and electrons can still homogeneously saturate the larger EAD trap by being injected outside of the zero-flux surface (5), indicated by its intersection with the cathode surface, of each individual magnetic trap. Of course, electrons may also be injected at, or inside the zero-flux surface, as discussed in the previous embodiments.

In FIG. 13, electron sources are, as in FIG. 12, located in the interstitial modules (91) at the interstices of the hexagonal arrangement. In this embodiment, some interstitial modules may, again, also house, separately or in combination with an electron source, gas introduction means for introducing either a sputtering or reactive gas. This magnetic pole arrangement, in FIG. 13, allows for sputtering from segmented targets, with outer diameters coinciding roughly with the zero-flux surfaces (5); or, alternatively, a large-area target, with outer diameter coinciding with that of the cathode housing (98). The latter large area target would, as in previous embodiments, provide holes through which the interstitial modules could inject electrons and/or gases into the EAD trap. The embodiments of FIGS. 12–13 are particularly useful for uniformly introducing gas/electrons over a large-area substrate. The embodiments of FIGS. 12–13 also avoid some of the deposition non-uniformity inherent in using a large target with a single erosion track. Also, while both the substrate and sources in FIGS. 12–13 are planar, The principles of the invention are easily extended to non-planar substrate, as well as to non-planar arrangements of the vapor sources.

While the magnet configurations in of the various magnetron embodiments serve to demonstrate the versatility of the disclosed process, many variations of the magnet configuration and resultant magnetic field may be realized without departing from the teachings or spirit of the invention. Additional chamber elements may also be introduced to additionally modify the magnetic field of the apparatus. Modification of the magnetic field shape and distribution may be accomplished through use of additional magnets, ferromagnetic materials, as well as materials selected for other practical magnetic characteristics, such as a magnetic coercivity, permeability, saturation, etc. As such, desirable modification of the magnetic field may also be achieved by selecting appropriate materials for constructing the chamber elements already discussed.

As is described in relation to FIG. 9, in certain embodiments of the invention, the vapor source may deliver condensable material to the substrate by delivering vapor across the field lines of the magnetic electron trap, so that the vapor source is external to the effective trap region. An additional embodiment utilizing this approach, in FIG. 14, wherein, as in previous embodiments, electrically floating structures providing the magnetic field are maintained separate from the substrate supporting structure.

Figure 14:
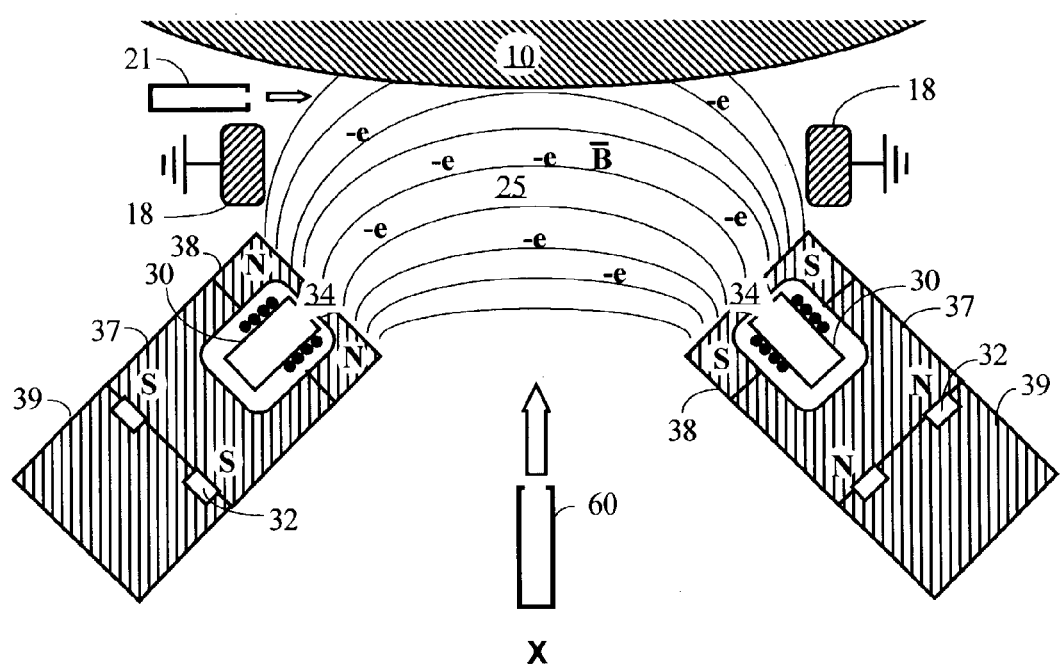
FIG. 14 is an alternative embodiment of the disclosed vapor deposition apparatus, utilizing a rotating drum.

As mentioned previously, the principles of the present invention may be extended to a variety of vapor source geometries. In this case of a linear source, a straightforward approach is to position a plurality of the integrated electron source/magnetic assembly, such as in FIG. 3, in a row, thereby forming an effective line source. In FIG. 14, the 'X' indicates an axis normal to the plane of the figure, indicating the long axis of the line source and the substrate fixture, which is represented in this embodiment as a rotating drum.

In this configuration, the integrated electron source/magnetic assembly of FIG. 3 is used with an opposing pole piece for defining a magnetic trap region that conveniently accommodates the geometrical restraints of such processes. Intersection of the magnetic field with the substrate surface is rendered symmetric about the major axis of the cylindrical surface, so that the deposition may be easily made uniform with respect to the cylindrical surface. As in previous embodiments, a vapor source (60) may be used alone, or in conjunction with reactive gas injection means (21) for reactively depositing material.

INDUSTRIAL APPLICABILITY

Because the present invention discloses a fundamentally new method of thin film deposition, it may be used in a broad range of applications. In addition to the damage sensitive films previously discussed, the disclosed deposition process may be used for a variety of optical materials applications. For example, the deposition of optical filters in telecommunications may benefit from the invention through its ability to deposit fully dense films without induced stress from high-energy ion bombardment. In addition, application-specific optical waveguide materials that may typically suffer from phase segregation or from precipitation of a doped ion can also benefit from the highly non-equilibrium nature of the disclosed deposition process.

In addition, the electron activation of the growth front is highly advantageous for the formation of more covalent, relatively low-melting temperature compounds, wherein complete reaction of the components is highly sensitive to processing conditions. Examples of such compounds would be many of the narrow bandgap materials used in photovoltaic research and infrared detection, such as cadmium sulfide, copper indium selenide, copper indium gallium selenide, indium phosphide, and the like.

The reactive gases used in the disclosed invention may be any elemental or molecular gas, or vapor, that may be introduced at the substrate for forming a solid film. As such the deposited material may be any of a wide variety of materials, including, but not limited to, solid compounds of oxides, nitrides, fluorides, carbides, borides, phosphides, selenides, sulfides, or tellurides. High temperature materials, such as SiC, III–V nitride compounds, and diamond-like materials will also benefit from the highly activating EAD environment of the present invention.

The ability of the invention to increase the sticking coefficient of relatively volatile, less reactive metals, such as bismuth, lead, tin, zinc, cadmium, and antimony, is useful in the stoichiometric deposition of many multicomponent materials. Such materials include many ferroelectric, piezoelectrics, pyroelectrics, conducting oxides, and narrow bandgap materials.

Complex compounds, such as the ferroelectric and superconducting perovskites are seen as materials that may be effectively and reproducibly formed with the disclosed process. For example, the ferroelectric perovskite, strontium bismuth tantalate (SBT) may be deposited by co-sputtering two target materials—separately or in a mosaic target—comprising an Sr—Bi intermetallic and the Ta metal, wherein the Sr in the intermetallic provides the high electron flux required for the EAD process, as described above. Similarly, barium strontium titanate (BST) may be deposited from a target material that includes a solid solution of Ba and Sr, as these two metals have a continuous solid solution range. Unlike previous sputtering processes, the enhanced activation of oxygen at the depositing film, due to the present EAD process, allows for the oxygen population near the sputtering targets to be maintained sufficiently low to allow metallic mode sputtering.

It should also be noted that the deposition processes and apparatus of the invention provide an excellent method for lowering the required substrate temperature for achieving epitaxial growth or the formation of a particular material phase. For example, because of this capacity to reduce the epitaxial temperature, the sputtering process disclosed would not require the normally high substrate temperatures of 775–800 Celsius to deposit epitaxial layers of $CeO_2$ or silicon.

Also, such operating conditions of the disclosed EAD process can be useful in forming certain high-temperature materials, such as gallium nitride, which have a tendency of being deposited in a reduced form. Such non-equilibrium characteristics will also be useful in depositing thin films of various metastable material phases, such as diamond or $Zr_3N_4$. Similarly, various materials in the GaAlInN phase space can be deposited with stoichiometric nitrogen incorporation, so that intrinsic semiconductor material may be formed, or, as in the case of $Zr_3N_4$, even a nitrogen over-stoichiometry may be achieved.

Also, it is noted that, while a best attempt has been made to explain the novel operating characteristics of the disclosed vapor deposition process and apparatus, the purpose of the present disclosure is to demonstrate the practical aspects of operating the present invention. Accordingly, although the present invention has been described in detail with reference to the embodiments shown in the drawing, it is not intended that the invention be restricted to such embodiments. It will be apparent to one practiced in the art that various departures from the foregoing description and drawing may be made without departure from the scope or spirit of the invention.

What is claimed is:

1. A vapor deposition apparatus for forming a film on a substrate, comprising:
   a. a vacuum chamber;
   b. means for positioning a substrate within the chamber, the substrate providing a first surface for forming the film thereon, the first surface electrically floating;
   c. a second surface, the second surface maintained at a negative potential;
   d. a vapor source, the vapor source positioned so as to direct a vapor towards the substrate, the vapor containing constituents for forming the film;
   e. magnetic field assembly means providing a magnetic field, the magnetic field possessing field lines that intersect first and second surfaces, the magnetic field providing containment of electrons; and,
   f. an electron source, the electron source positioned for providing a flux of electrons centrally into the magnetic field, the flux sufficiently large to provide a negative space-charge adjacent to the first surface, so that a substantial plasma sheath is unable to form at the first surface, the negative space-charge providing a negative potential, $V_s$, to the first surface, wherein acceleration of positive ions toward the first surface by $V_s$ is substantially prevented by the negative space-charge.

* * * * *